(12) United States Patent
Chen et al.

(10) Patent No.: US 7,423,561 B2
(45) Date of Patent: Sep. 9, 2008

(54) MODULATION METHODS AND SYSTEMS

(75) Inventors: Hsin-Cheng Chen, Tainan Hsien (TW); Pi-Hai Liu, Taipei (TW); Ming-Yang Chao, Hsin-Chu Hsien (TW)

(73) Assignee: Mediateck Inc., Hsin-Chu (TW)

( * ) Notice: Subject to any disclaimer, the term of this patent is extended or adjusted under 35 U.S.C. 154(b) by 0 days.

(21) Appl. No.: 11/758,655

(22) Filed: Jun. 5, 2007

(65) Prior Publication Data

US 2007/0229327 A1    Oct. 4, 2007

Related U.S. Application Data

(63) Continuation-in-part of application No. 11/550,420, filed on Oct. 18, 2006, which is a continuation of application No. 11/162,323, filed on Sep. 6, 2005, now Pat. No. 7,142,135.

(51) Int. Cl.
*H03M 7/00* (2006.01)
(52) U.S. Cl. ......................... 341/59; 375/253
(58) Field of Classification Search ............. 341/59, 341/50, 58, 68; 375/253, 242, 246
See application file for complete search history.

(56) References Cited

U.S. PATENT DOCUMENTS

| | | | |
|---|---|---|---|
| 5,365,231 A | 11/1994 | Niimura | |
| 5,696,505 A | 12/1997 | Schouhamer Immink | |
| 5,731,768 A | 3/1998 | Tsang | |
| 5,742,243 A | 4/1998 | Moriyama | |
| 5,952,944 A | 9/1999 | Nonaka | |
| 6,268,810 B1 | 7/2001 | Shim | |
| 6,297,753 B1 | 10/2001 | Hayami | |
| 6,445,313 B2 | 9/2002 | Ahn | |
| 6,542,452 B1 | 4/2003 | Wu | |
| 6,559,779 B2 | 5/2003 | Noda | |
| 6,573,848 B2 | 6/2003 | Hayami | |
| 6,670,896 B2 | 12/2003 | Hayami | |
| 6,690,308 B2 | 2/2004 | Hayami | |
| 6,807,137 B2 | 10/2004 | Chuang | |
| 6,853,684 B2 * | 2/2005 | Wu et al. | 375/253 |
| 7,016,286 B2 | 3/2006 | Hayami et al. | |
| 2002/0118125 A1 | 8/2002 | Noda et al. | |
| 2003/0002184 A1 | 1/2003 | Hayami et al. | |

* cited by examiner

*Primary Examiner*—Rexford Barnie
*Assistant Examiner*—Joseph Lauture
(74) *Attorney, Agent, or Firm*—Winston Hsu

(57) ABSTRACT

A modulation method for symbols in a frame of a compact disc includes the steps of receiving a plurality of data words, modulating each data word into a code word of a corresponding data symbol, and providing a plurality of combinations of potential merge bits to be inserted between successive symbols of the frame. At least one combination of candidate merge bits is generated according to the plurality of combinations of potential merge bits, a data symbol immediately preceding the location of the candidate merge bits, and a data symbol immediately succeeding the location of the candidate merge bits. The combination of candidate merge bits which minimizes (optimizes) the absolute cumulative DSV is selected when a subsequent group of possible combinations of candidate merge bits is detected or after a predetermined delay, and the selected combination of candidate merge bits is inserted between the two successive data symbols.

18 Claims, 32 Drawing Sheets

| Data word | State 0 | | State 1 | | State 2 | |
|---|---|---|---|---|---|---|
| | Code word | Next state | Code word | Next state | Code word | Next state |
| 00 | 100010 00000* | 0 | 010100 01000* | 0 | 010100 01000* | 0 |
| 01 | 100010 00000# | 1 | 010100 010001 | 1 | 010100 010001 | 1 |
| 02 | 100010 000010 | 0 | 010100 010010 | 0 | 010100 010010 | 0 |
| 03 | 100010 000010 | 1 | 010100 010010 | 1 | 010100 010010 | 1 |
| 04 | 100010 10000* | 0 | 010100 01010* | 0 | 010100 01010* | 0 |
| 05 | 100010 10000# | 1 | 010100 010101 | 1 | 010100 010101 | 1 |
| 06 | 100010 100010 | 0 | 010100 010100 | 2 | 010100 010100 | 2 |
| ... | ... | | ... | | ... | |

Fig. 3

| Data word | State 0 | | | State 1 | | | State 2 | | |
|---|---|---|---|---|---|---|---|---|---|
| | $PSD_0$ | $PSD_1$ | $ID_{DSV}$ | $PSD_0$ | $PSD_1$ | $ID_{DSV}$ | $PSD_0$ | $PSD_1$ | $ID_{DSV}$ |
| 00 | 4 | 2 | 0 | -2 | 0 | 0 | -2 | 0 | 0 |
| 01 | 4 | 2 | 1 | 0 | 0 | 0 | 0 | 0 | 0 |
| 02 | 0 | 0 | 0 | 2 | 2 | 0 | 2 | 2 | 0 |
| 03 | 0 | 0 | 0 | 2 | 2 | 0 | 2 | 2 | 0 |
| 04 | -8 | -6 | 0 | 4 | 2 | 0 | 4 | 2 | 0 |
| 05 | -8 | -6 | 1 | 2 | 2 | 0 | 2 | 2 | 0 |
| 06 | -4 | -4 | 0 | 4 | 4 | 0 | 4 | 4 | 0 |
| ⋮ | ⋮ | ⋮ | ⋮ | ⋮ | ⋮ | ⋮ | ⋮ | ⋮ | ⋮ |

Fig. 12

| Data word | Partial DSV |
|---|---|
| 00 00 00 00 | 2 |
| 00 00 10 00 | 0 |
| 00 00 00 | 5 |
| 00 00 01 | -1 |
| 00 00 10 | -3 |
| 00 00 11 | 3 |
| 00 01 | 0 |
| 00 10 | -4 |
| 00 11 | 2 |
| 01 | -1 |
| 10 | 1 |
| 11 | 3 preceding data word = 10<br>3 preceding data word = even number of 11<br>-1 preceding code word = odd number of 11 |

Fig. 16

| Data word | Code word | |
|---|---|---|
| 00 00 00 00 | 010 100 100 100 | |
| 00 00 10 00 | 000 100 100 100 | |
| 00 00 00 | 010 100 000 | |
| 00 00 01 | 010 100 100 | |
| 00 00 10 | 000 100 000 | |
| 00 00 11 | 000 100 100 | |
| 00 01 | 000 100 | |
| 00 10 | 010 000 | |
| 00 11 | 010 100 | |
| 01 | 010 | |
| 10 | 001 | |
| 11 | 000 | preceding code word = xx1 |
|   | 101 | preceding code word = xx0 |

Fig. 17

| | Combined code word Z(s) before 2T corrector | Combined code word Z'(s) after 2T corrector | Replace or not |
|---|---|---|---|
| Odd 1's | 01_0000_0100_0010_000 | 01_0000_0100_0010_000 | N |
| Odd 1's | 01_0001_0001_0001_010 | 01_0000_0001_0000_010 | Y |
| Even 1's | 00_0100_0010_0100_100 | 00_0100_0010_0100_100 | N |
| Even 1's | 00_0010_0001_0000_101 | 00_0010_0001_0001_001 | Y |

Fig. 28

MODULATION METHODS AND SYSTEMS

CROSS REFERENCE TO RELATED APPLICATIONS

This application is a continuation-in-part of applicant's earlier application Ser. No. 11/550,420, filed Oct. 18, 2006, which is in turn a continuation of applicant's earlier application Ser. No. 11/162,323, filed Sep. 6, 2005. The entirety of both applications is hereby incorporated by reference.

BACKGROUND OF THE INVENTION

1. Field of the Invention

The present invention relates to modulation methods and systems for recording digital data on an information medium such as an optical disc, more particularly to modulation methods and systems for minimizing a cumulative digital sum value (DSV) for high-density optical storage systems.

2. Description of the Prior Art

Prior to transmission or recording of digital data, the digital data is usually converted to another data pattern through a certain modulation method. In compact disc (CD) recording systems, the data to be recorded on a compact disc is modulated using EFM (eight-to-fourteen modulation), whereas the data to be recorded on a digital versatile disc (DVD) is modulated using EFM+ (eight-to-sixteen modulation).

However, during the process of EFM or EFM+ modulation, it is important to keep the DSV value as close to zero as possible to allow reliable tracking and reliable detection of high frequency signals. Therefore, there were several methods proposed for keeping the absolute value of the DSV as low as possible to suppress DC (direct current) content during a modulation procedure. In advanced optical discs such as Blu-ray disc (BD), and high density DVD (HD-DVD), to improve the ability of suppressing DC (direct current) content during the modulation procedure, DC (DSV) control bits are included in 17PP modulation for BD and eight-to-twelve modulation for HD-DVD. By controlling the values of DC control bits, the absolute value of the cumulative DSV could be kept as low as possible to suppress DC content during the modulation procedure.

FIG. 1 shows a functional block diagram of an 8-16 (EFM+) modulation system for transforming 8-bit data word B(t) into 16-bit code words X(t). During the modulation procedure, each 8-bit data word B(t) associated with a current state S(t) is converted to a main code word $X_m(t)$ having 16 channel bits and a main next state $S_m(t+1)$ through a main conversion table 11. If the data word B(t) is less than eighty-eight, a comparator 13 enables a substitution conversion table 12 to simultaneously output a sub code word $X_s(t)$ and a sub next state $S_s(t+1)$. Meanwhile, a DSV controller 14 is also enabled to calculate a DSV corresponding to each of the main and sub code words, and select one of the code words to be the output code word X(t). The code word X(t) is selected so as to minimize (optimize) the absolute value of the cumulative DSV. If the main code word $X_m(t)$ is selected as the code word X(t), the main next state $S_m(t+1)$ is designated as the next state S(t+1). The next state S(t+1) is temporarily stored in the state register 15. Similarly, if the sub code word $X_s(t)$ is selected as the code word X(t), the sub next state $S_s(t+1)$ is designated as the next state S(t+1). For DVD modulation, a code word X(t) is obtained through the aforesaid conversion tables 11 and 12 when a data word B(t) and the corresponding current state S(t) are known. The code word X(t) is independent from subsequent data word B(t+1).

During the modulation process for a high density optical storage system such as HD-DVD, Blu-ray, or AOD system, a modulation code word is obtained after determination of the DSV control bit. A DSV control bit may not exist in each data word, and ideally, the determination of the DSV control bits should depend upon all the data words so that the overall cumulative DSV is kept to the minimum. Consequently, a large number of registers is required for storing data words or code words during the modulation process, which also result in a long latency delay.

SUMMARY OF THE INVENTION

Modulation methods and systems for recording digital data on an optical storage medium are provided. Merge bits to be inserted between successive symbols in a frame of a compact disc are selected in order to minimize (optimize) the absolute cumulative digital sum value (DSV).

In some embodiments, a modulation method for symbols in a frame of a compact disc comprises the steps of receiving a plurality of data words, modulating each data word into a code word of a corresponding data symbol, and providing a plurality of combinations of potential merge bits to be inserted between successive symbols of the frame. At least one combination of candidate merge bits is generated according to the plurality of combinations of potential merge bits, a data symbol immediately preceding the location of the candidate merge bits, and a data symbol immediately succeeding the location of the candidate merge bits. Each combination of candidate merge bits satisfies a predetermined run length restriction on bits contained in the frame. When a group of possible combinations of candidate merge bits is detected, a cumulative digital sum value (DSV) is calculated for each combination of candidate merge bits, the combination of candidate merge bits which minimizes (optimizes) the absolute cumulative DSV is selected when a subsequent group of possible combinations of candidate merge bits is detected or after a predetermined delay, and the selected combination of candidate merge bits is inserted between the two successive data symbols.

In some other embodiments, a modulation system for modulating symbols in a frame of a compact disc comprises a code table for converting a plurality of data words into code words for corresponding data symbols and a Run Length Limited (RLL) checking device. The RRL checking device receives a plurality of combinations of potential merge bits to be inserted between successive symbols of the frame and generates at least one combination of candidate merge bits according to the plurality of combinations of potential merge bits, a data symbol immediately preceding the location of the candidate merge bits, and a data symbol immediately succeeding the location of the candidate merge bits, wherein each combination of candidate merge bits satisfies a predetermined run length restriction on bits contained in the frame. A digital sum value (DSV) controller operates when a group of possible combinations of candidate merge bits is detected. The DSV controller calculates a cumulative DSV for each combination of candidate merge bits, selects the combination of candidate merge bits which minimizes (optimizes) the absolute cumulative DSV when a subsequent group of possible combinations of candidate merge bits is detected or after a predetermined delay, and inserts the selected combination of candidate merge bits between the two successive data symbols.

In some other embodiments, a modulation method for symbols in a frame of a compact disc comprises receiving a plurality of data words, modulating each data word into a code word of a corresponding data symbol, and providing a plurality of combinations of potential merge bits to be inserted between successive symbols of the frame. At least one combination of candidate merge bits is generated according to the plurality of combinations of potential merge bits, a data symbol immediately preceding the location of the candidate merge bits, and a data symbol immediately succeeding the location of the candidate merge bits. Each combination of candidate merge bits satisfies a Modified Run Length Limited (MRLL) 1-10 rule stipulating that binary ones are separated by a minimum of one and a maximum of ten binary zeroes. When a group of possible combinations of candidate merge bits is detected, a cumulative digital sum value (DSV) is calculated for each combination of candidate merge bits, the combination of candidate merge bits which minimizes (optimizes) the absolute cumulative DSV is selected when a subsequent group of possible combinations of candidate merge bits is detected or after a predetermined delay, and the selected combination of candidate merge bits is between the two successive data symbols.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 3 expresses an example of a portion of the code conversation table shown in FIG. 2.

FIG. 12 shows a portion of an exemplary partial DSV table.

FIG. 16 represents an example of a so-called mapping table that converts data words to partial DSVs.

FIG. 17 shows an example implementation of the encoder shown in FIG. 14 for the conversion from data word to code word.

FIG. 28 shows code words combinations with different polarity.

DETAILED DESCRIPTION

Figure 1:
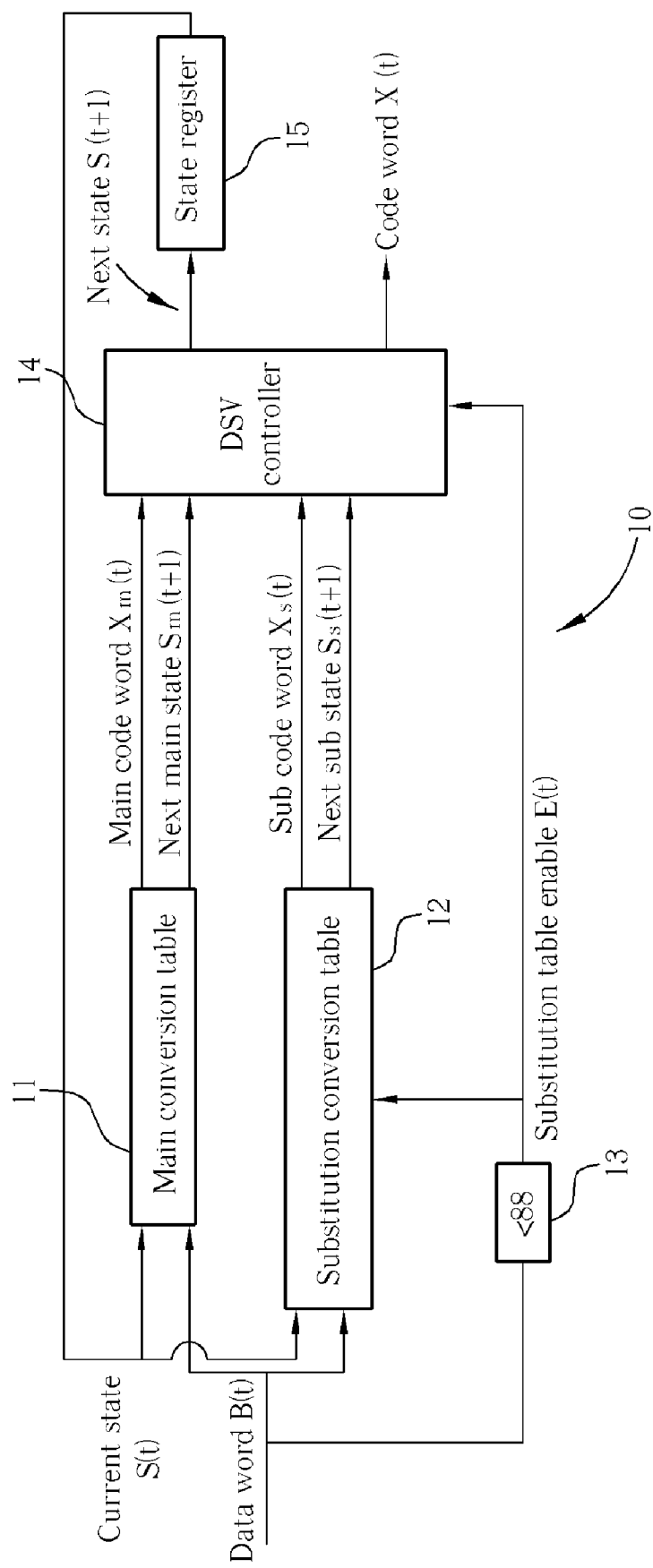
FIG. 1 shows a functional block diagram for EFM+ modulation.
Figure 2:
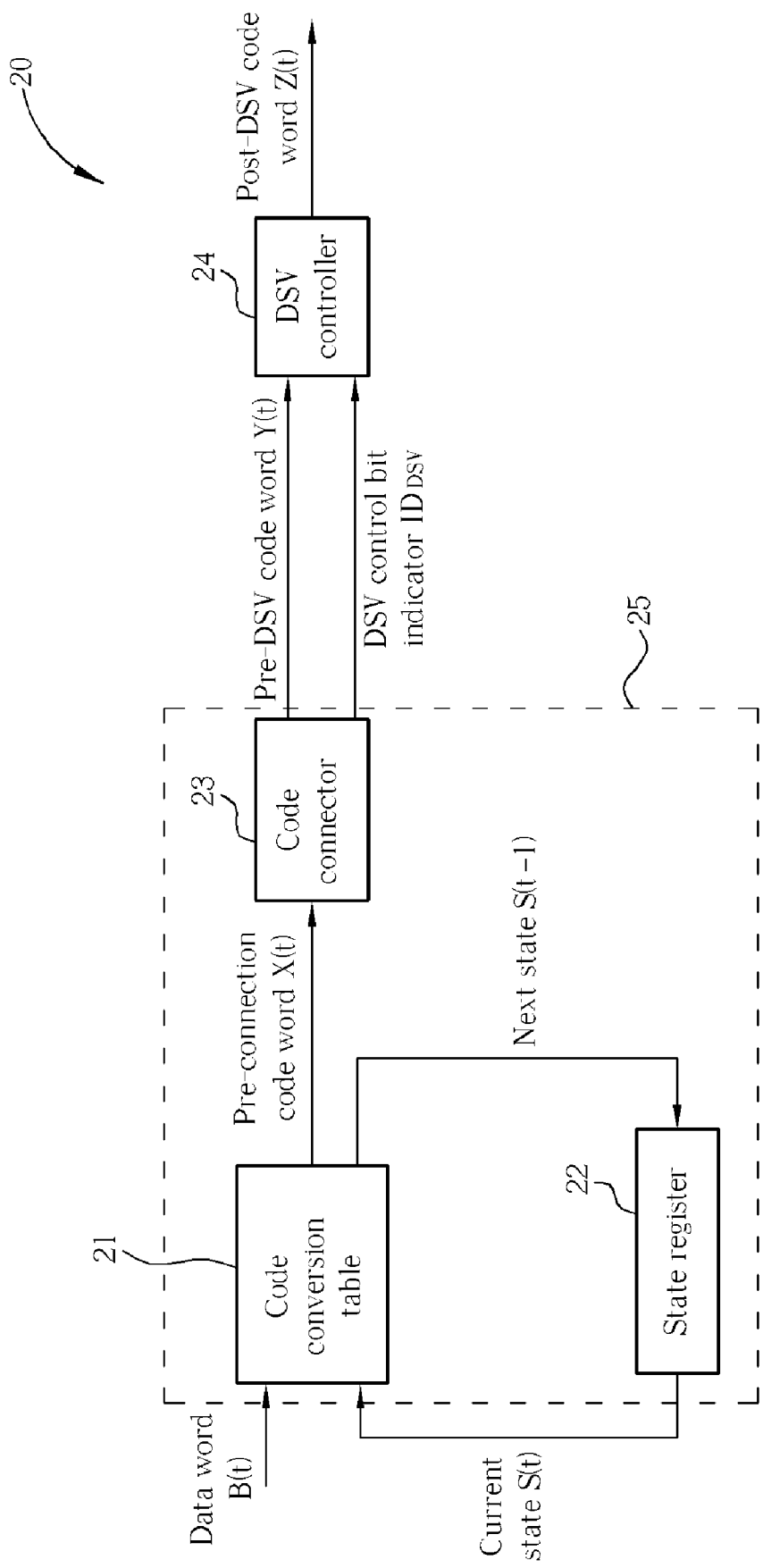
FIG. 2 is a functional block diagram showing an embodiment of a modulation system.

FIG. 2 is a block diagram showing an embodiment of a modulation system 20 in a high-density recording system. For example, in an HD-DVD recording system, 8-bit data words will be transformed into 12-bit code words through a modulation system 20 as shown in FIG. 2, and the 12-bit code words is for recording on an optical disc. During the modulation procedure, the 8-bit data word B(t) associated with a current state S(t) read from a state register 22 is converted to a pre-connection word X(t) through a conversion table 21, and in the meanwhile, a next state S(t+1) is also derived and stored in the state register 22. FIG. 3 expresses an example of a portion of the code conversation table 21. Concatenation rules for code words should be applied to connect the pre-connection code words X(t) derived from the conversion table 21. If adjoining pre-connection code words X(t) fit in some specific patterns, these pre-connection code words X(t) should be modified by a code connector 23. The code connector 23 generates and outputs pre-DSV code words Y(t), and if a pre-connection code word X(t) includes a DSV control bit, it also outputs a DSV control bit indicator $ID_{DSV}$ to a DSV controller 24. The DSV controller 24 determines the value of a current DSV control bit which minimizes (optimizes) the absolute cumulative DSV when it detects a subsequent DSV control bit from the code connector 23 or after a predetermined delay, and generate a post-DSV code word Z(t) according to the corresponding pre-DSV code word Y(t) and the determined current DSV control bit to achieve a minimized (optimized) absolute cumulative DSV. The post-DSV code word Z(t) may be generated by modifying, inserting, or updating the corresponding pre-DSV code word Y(t) according to the determined current DSV control bit. Another way to generate the post-DSV code word Z(t) is to generate more than one possible code words corresponding to the corresponding pre-DSV code word Y(t). Z(t) is selected from one of the possible code words corresponding to the determined current DSV control bit. The conversion table 21, state register 22, and code connector 23 act as an encoder 25. In some embodiments, the timing for the DSV controller 24 to determine the value of the current DSV control bit may not depend upon the detection of the subsequent DSV control bit. The DSV controller 24 may wait until a second, a third, or a fourth subsequent DSV control bit has arrived, and then determine the current DSV control bit which minimizes (optimizes) the absolute cumulative DSV. It is also possible that the DSV controller 24 may determines more than one DSV control bit at a time. In some other embodiments such as a Blu-ray system, the current DSV control bit may be determined before the arrival of the subsequent DSV control bit.

Figure 4:
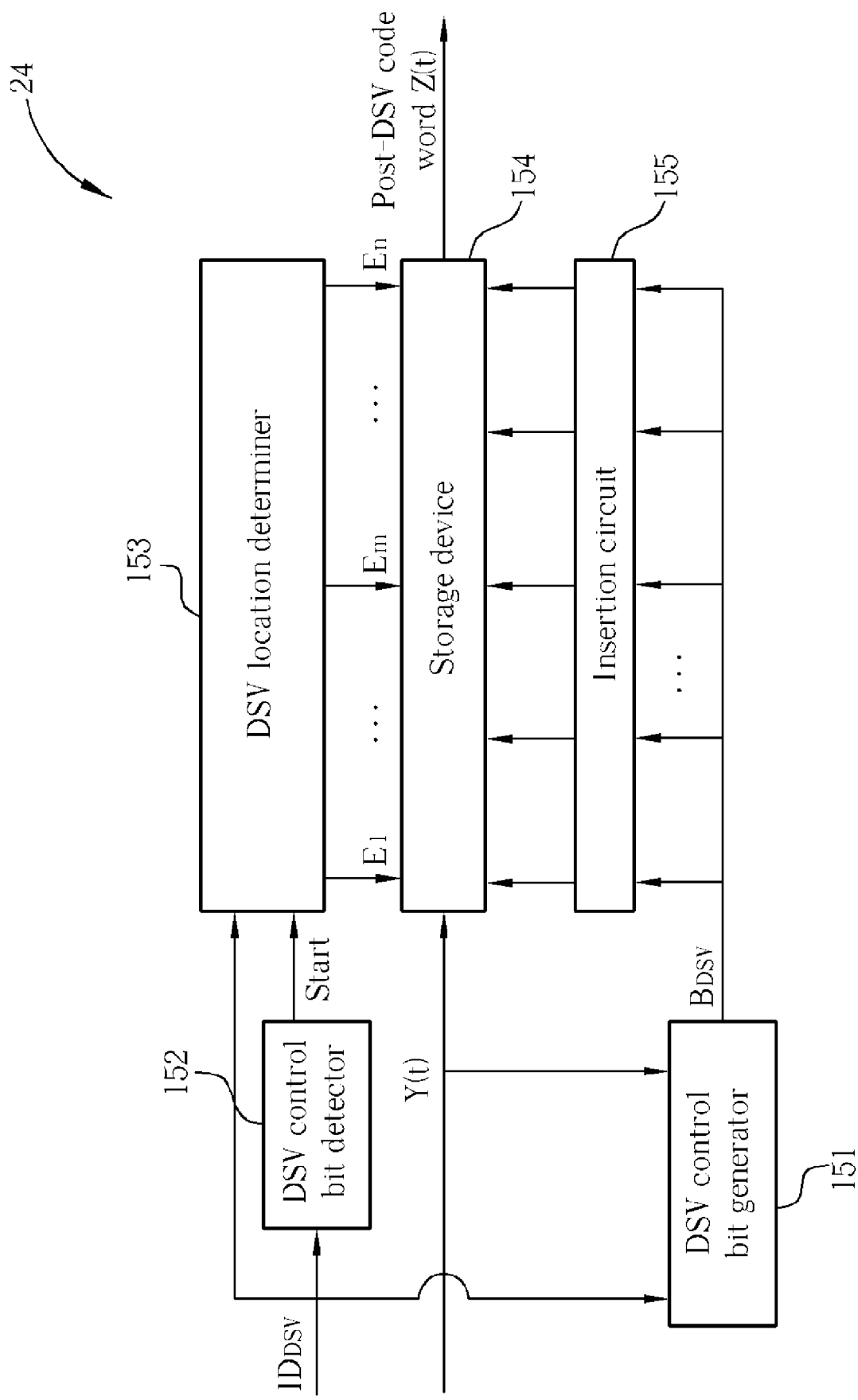
FIG. 4 is a functional block diagram showing an embodiment of the DSV controller in FIG. 2.

FIG. 4 shows an embodiment of the DSV controller 24, the DSV controller 24 includes a DSV control bit generator 151, a DSV control bit detector 152, a DSV location determiner 153, a storage device 154, and an insertion circuit 155. The DSV control bit generator 151 calculates a cumulative DSV for each possible value corresponding to a current control bit, and determines the current DSV control bit $B_{DSV}$ that minimizes (optimizes) the cumulative DSV. The DSV control bit detector 152 detects whether any DSV control bit exists in the current code word according to the DSV control bit indicator $ID_{DSV}$. When a DSV control bit is detected, the DSV control bit detector 152 notifies the DSV location determiner 153. The storage device 154 stores each of the pre-DSV code words Y(t) generated by the code connector. In some embodiments, the storage device 154 comprises a series of pipe registers, delay registers, or shift registers, wherein each register stores one of the pre-DSV code word Y(t). In some other embodiments, the storage device 154 may be a first-in first-out (FIFO) memory, or a random access memory (RAM) with a write/read address generator. The number of registers is preferably greater than or equal to the maximum number of code words (or data words) between the occurrences of two consecutive DSV control bits. In an embodiment, the maximum number of code words between two consecutive DSV control bits may be the number of words in one frame, for example, 93 words, and it may be the number of words in two frames if considering that the DSV control bit in the frame sync field is used for ROPC (read optimum power calibration). The pre-DSV code words Y(t) are sequentially piped in the storage device 154. The DSV location determiner 153 records the location of each code word having a DSV control bit. For example, the DSV location determiner 153 keeps tracking the storage location of the code word having a first DSV control bit until receiving the code word having a second DSV control bit. When the DSV location determiner 153 receives a DSV control bit indicator $ID_{DSV}$ indicating the arrival of the second DSV control bit, it sends an enabling signal ($E_1, E_2, \ldots, E_n$) to a register of the storage device 154 storing the code word having the first DSV control bit. If the code word having the first DSV control bit is currently stored in the $m^{th}$ register of the storage device 154, the DSV location determiner 153 outputs the enabling signal $E_m$ to instruct the storage device 154 to allow the insertion of the determined current DSV control bit from the insertion circuit 155 to the $m^{th}$ register. By analogy, the second DSV control bit is determined and inserted into the corresponding register of the storage device 154 when the DSV location determiner 153 receives a DSV control bit indicator $ID_{DSV}$ indicating the arrival of the third DSV control bit, and so on. In this way, a DSV control bit is determined and inserted into the corresponding register of the storage device 154 when the DSV location determiner 153 receives a DSV control bit indicator $ID_{DSV}$ indicating the arrival of the subsequent DSV control bit. Instead of inserting a single DSV control bit into a code word, a code word might have two DSV control bits. In this case, it would be necessary to keep track of the individual bits within the code word to control the insertion of the two DSV control bits. In some other embodiments, the DSV control bits originally existed in the code words or data words are default values or arbitrary values, which will be modified in accordance to the determined DSV control bits generated by the DSV control bit generator. In some other embodiments, the digital words corresponding to the possible DSV control bits values are stored in the registers, then one of the digital words is selected in accordance to the determined DSV control bits generated by the DSV control bit generator. The digital words may be data words, final code words, or tentative code words, where the tentative code words are generated from the data words during modulation, and are used for generating the final code words.

Figure 5:
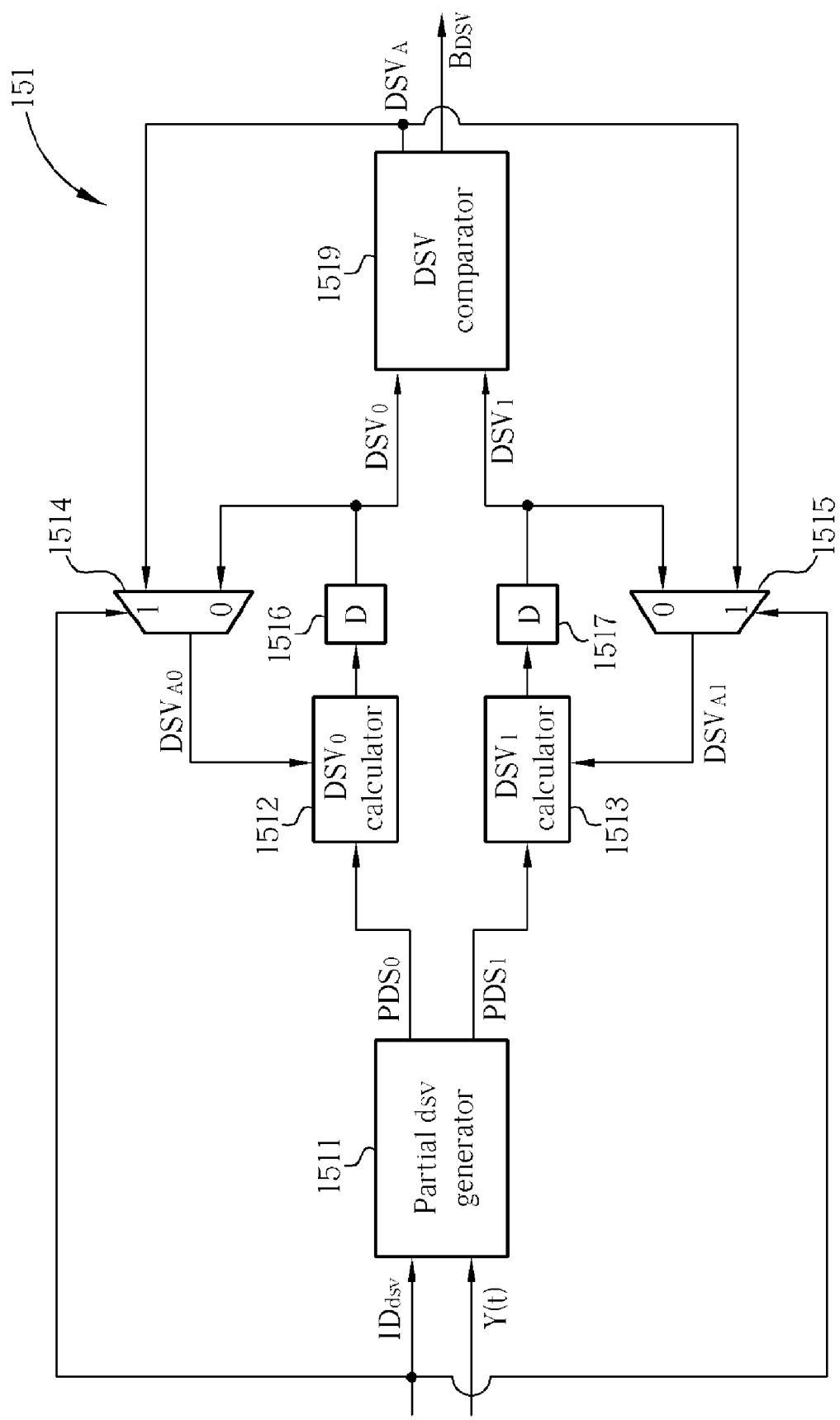
FIG. 5 is a functional block diagram showing an embodiment of the DSV control bit generator in FIG. 4.

FIG. 5 is a block diagram showing an embodiment of the DSV control bit generator 151 in FIG. 4. Because a DSV control bit has two possible values, 0 and 1, the DSV control bit generator 151 determines the value which minimizes (optimizes) the absolute cumulative DSV. A partial DSV generator 1511 simultaneously generates two partial DSVs, $PSD_0$ and $PSD_1$, according to a tentative code word Y(t). If the tentative code word Y(t) does not have any DSV control bit, the two partial DSVs, $PSD_0$ and $PSD_1$, generated by the partial DSV generator 1511 are the same. If the tentative code word Y(t) has a DSV control bit as indicated by $ID_{DSV}$, the two partial DSVs, $PSD_0$ (assuming the current DSV control bit $B_{DSV}=0$) and $PSD_1$ (assuming the current DSV control bit $B_{DSV}=1$), are generated by the partial DSV generator 1511, respectively. The $DSV_0$ calculator 1512 adds the partial DSV $PSD_0$ to the cumulative DSV $DSV_{A0}$, or substrates the partial DSV $PSD_0$ from the cumulative DSV $DSV_{A0}$ according to the polarity of the cumulative DSV $DSV_{A0}$. When the subsequent tentative code word Y(t) output from the code connector 23 does not have any DSV control bit, the cumulative DSV $DSV_{A0}$ is selected from the value stored in the corresponding register 1516. After calculation, the value calculated by the $DSV_0$ calculator 1512 is stored in the register 1516 to update the original stored value. In the same manner, the $DSV_1$ calculator 1513 adds the partial DSV $PSD_1$ to the cumulative DSV $DSV_{A1}$, or substrates the partial DSV $PSD_1$ from the cumulative DSV $DSV_{A1}$ according to the polarity of the cumulative DSV $DSV_{A1}$. When the subsequent tentative code word Y(t) output from the code connector 23 does not have any DSV control bit, the cumulative DSV $DSV_{A1}$ is selected from the value stored in the corresponding register 1517. The value calculated by the $DSV_1$ calculator 1513 is then stored in the register 1517. When a subsequent DSV control bit is detected as indicated by $ID_{DSV}$, the DSV comparator 1519 compares the cumulative DSVs $DSV_0$ and $DSV_1$ and chooses the minimum absolute value among which as the updated cumulative $DSV_A$. Besides, the DSV comparator 1519 also designates the bit value corresponding to a minimum absolute value as the value of the current DSV control bit $B_{DSV}$. Meanwhile, the two multiplexes, 1514 and 1515, select the updated cumulative $DSV_A$ as the cumulative DSVs of the two branches, that is, $DSV_{A0}$ and $DSV_{A1}$ for cumulative DSV calculations in the $DSV_0$ calculator 1512 and $DSV_1$ calculator 1513. After cumulative DSV calculation, the values calculated by the $DSV_0$ calculator 1512 and $DSV_1$ calculator 1513 are stored to the corresponding registers 1516 and 1517 as the newly updated cumulative DSVs. In this way, a DSV control bit could be determined by comparing the two branches of cumulative DSV calculations when a subsequent DSV control bit is detected.

Figure 6:
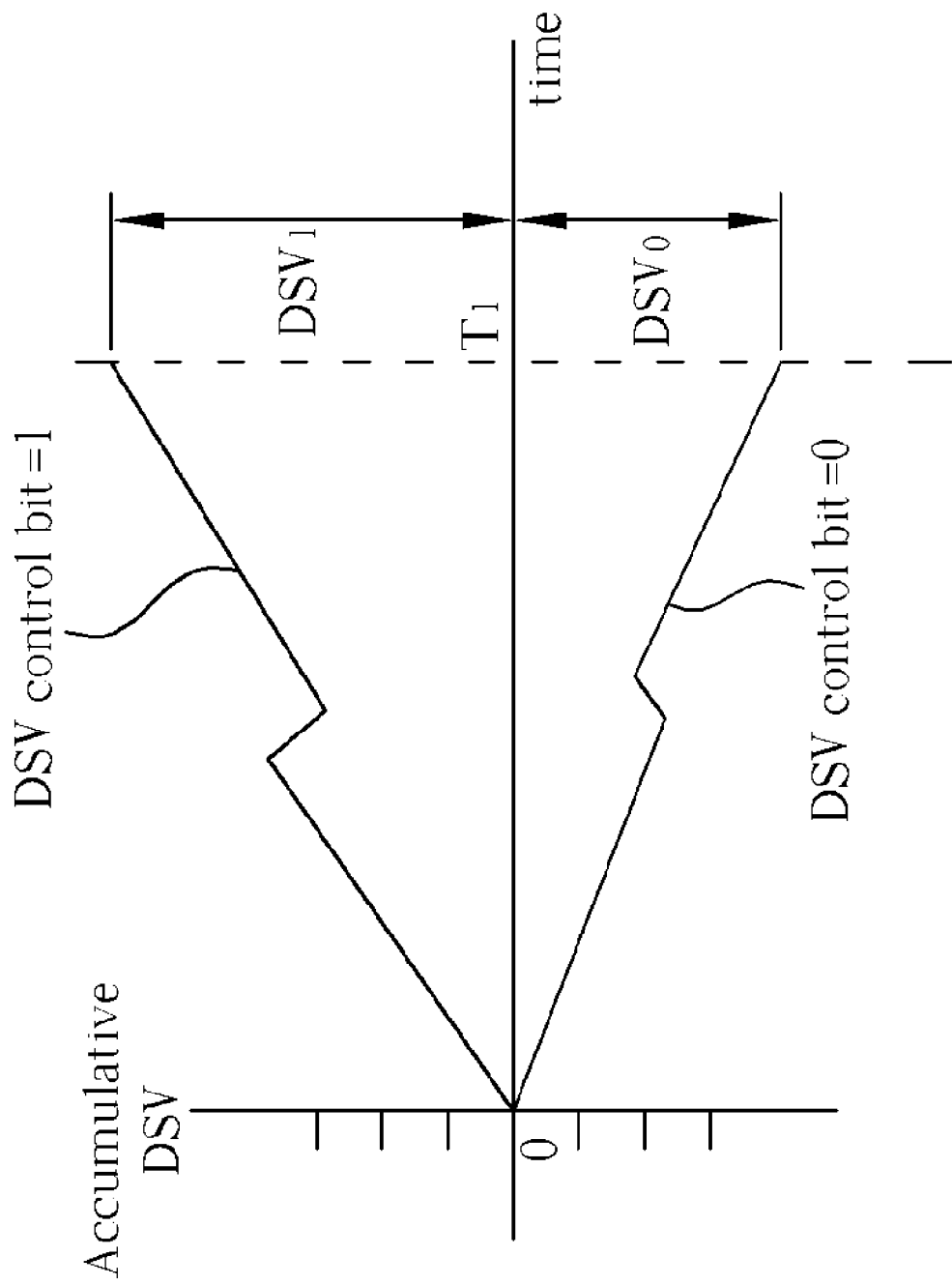
FIGS. 6-7 are graphs illustrating cumulative DSV calculation.

As shown in the example of FIG. 6, the current DSV control bit is determined by comparing two possible values corresponding to the current DSV control bit, which are absolute cumulative DSVs $DSV_0$ and $DSV_1$, when detecting a subsequent DSV control bit at time $T_1$. In some other embodiments, time $T_1$, the timing for comparing the cumulative DSVs, may be a constant predetermined interval. In the example of FIG. 6, $DSV_0$ is smaller than $DSV_1$ at time $T_1$, and hence the current DSV control bit is selected as 0.

Figure 7:
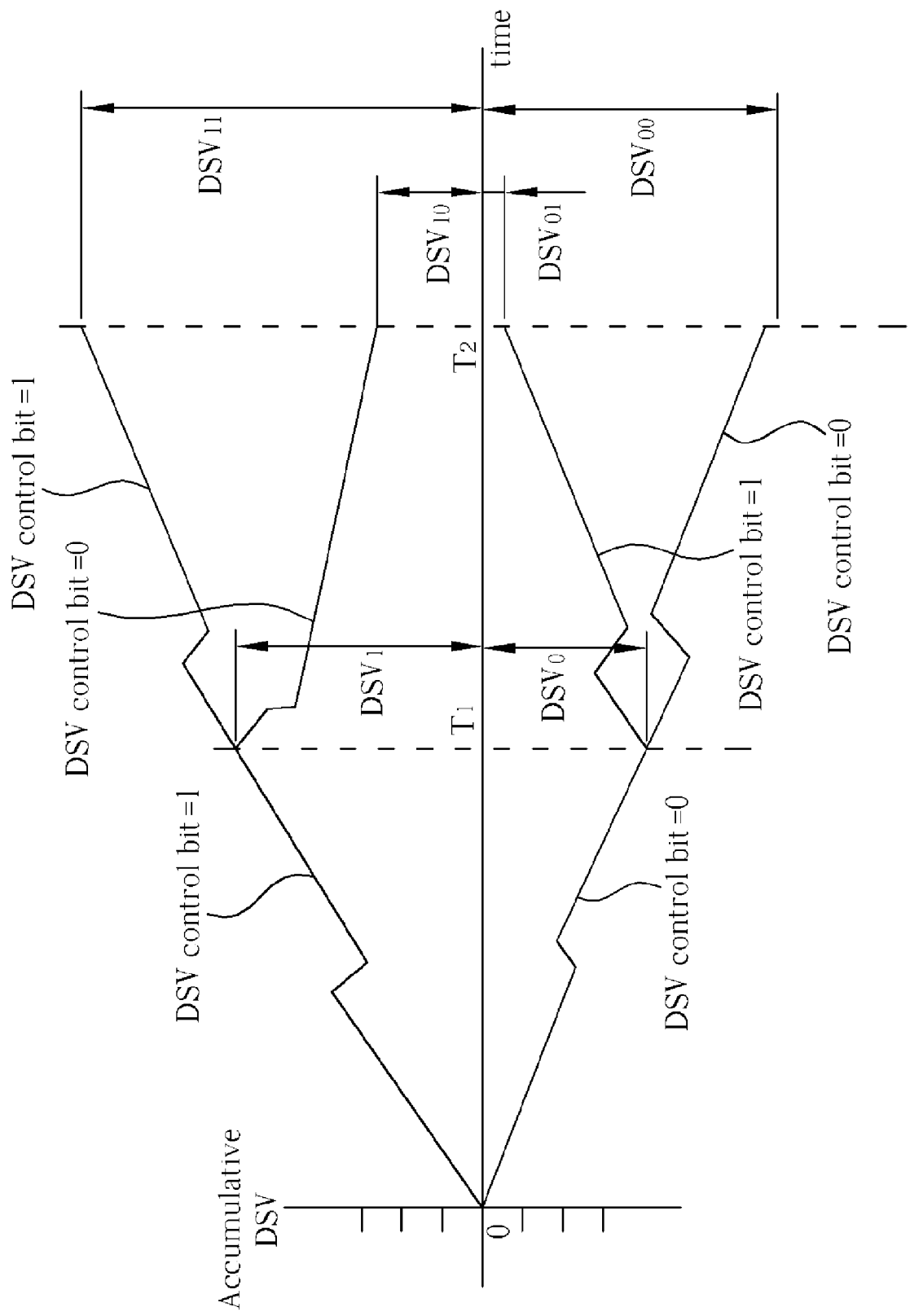

Moreover, the current DSV control bit can be determined when two subsequent DSV control bits are detected, as shown in the example of FIG. 7. The current DSV control bit is not determined when the first subsequent DSV control bit is detected at time $T_1$. Each of the cumulative DSVs is split into two branches after time $T_1$. When the second subsequent DSV control bit is detected at time $T_2$, the DSV comparator 1519 determines the current DSV control bit by comparing the four possible values corresponding to both the current and first subsequent DSV control bits, which are the absolute cumulative DSVs, $DSV_{00}$, $DSV_{01}$, $DSV_{10}$, and $DSV_{11}$, or in some embodiments, both the current and subsequent DSV control bits can be determined accordingly. In this example, $PSD_{01}$ is the minimum out of the four absolute cumulative DSVs, and hence the current DSV control bit is designated as 0.

Figure 8:
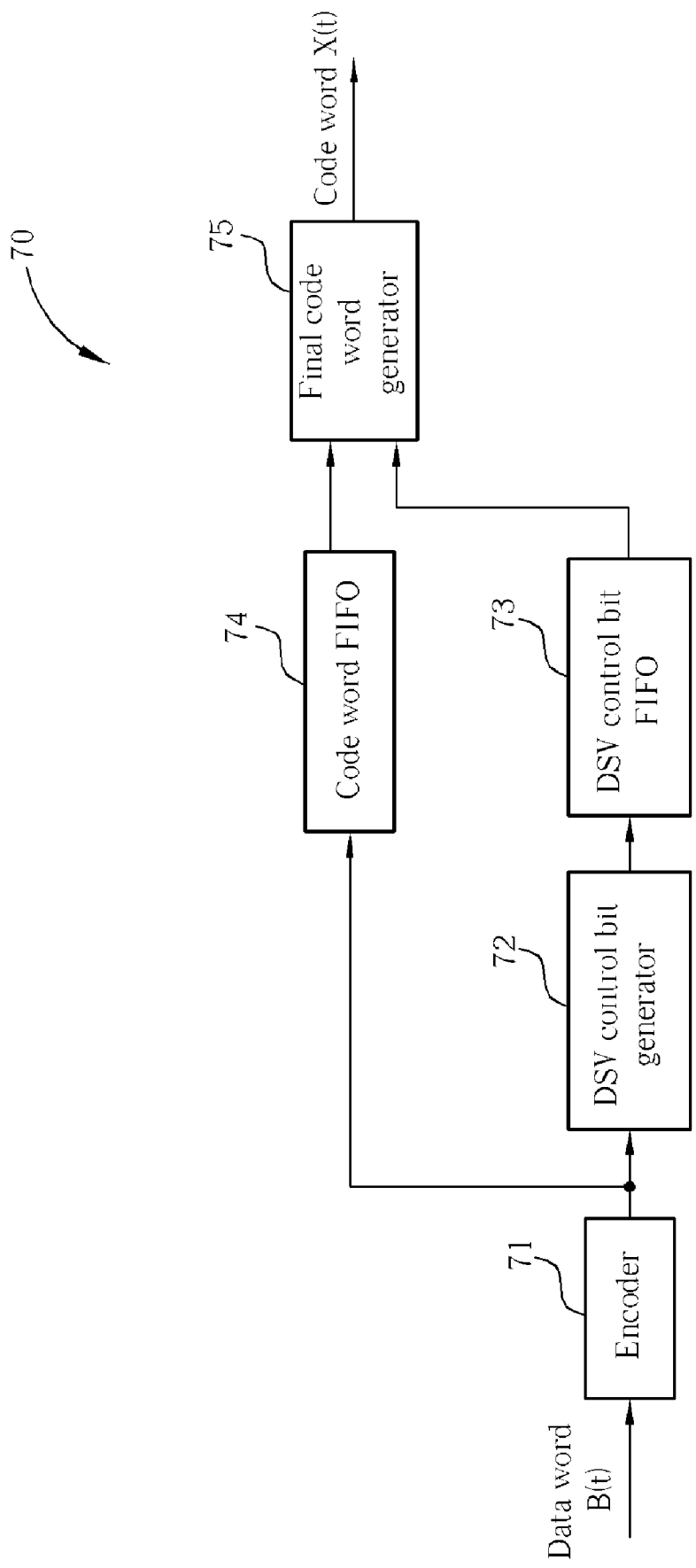
FIGS. 8-10 are functional block diagrams showing embodiments of modulation systems.
Figure 8A:
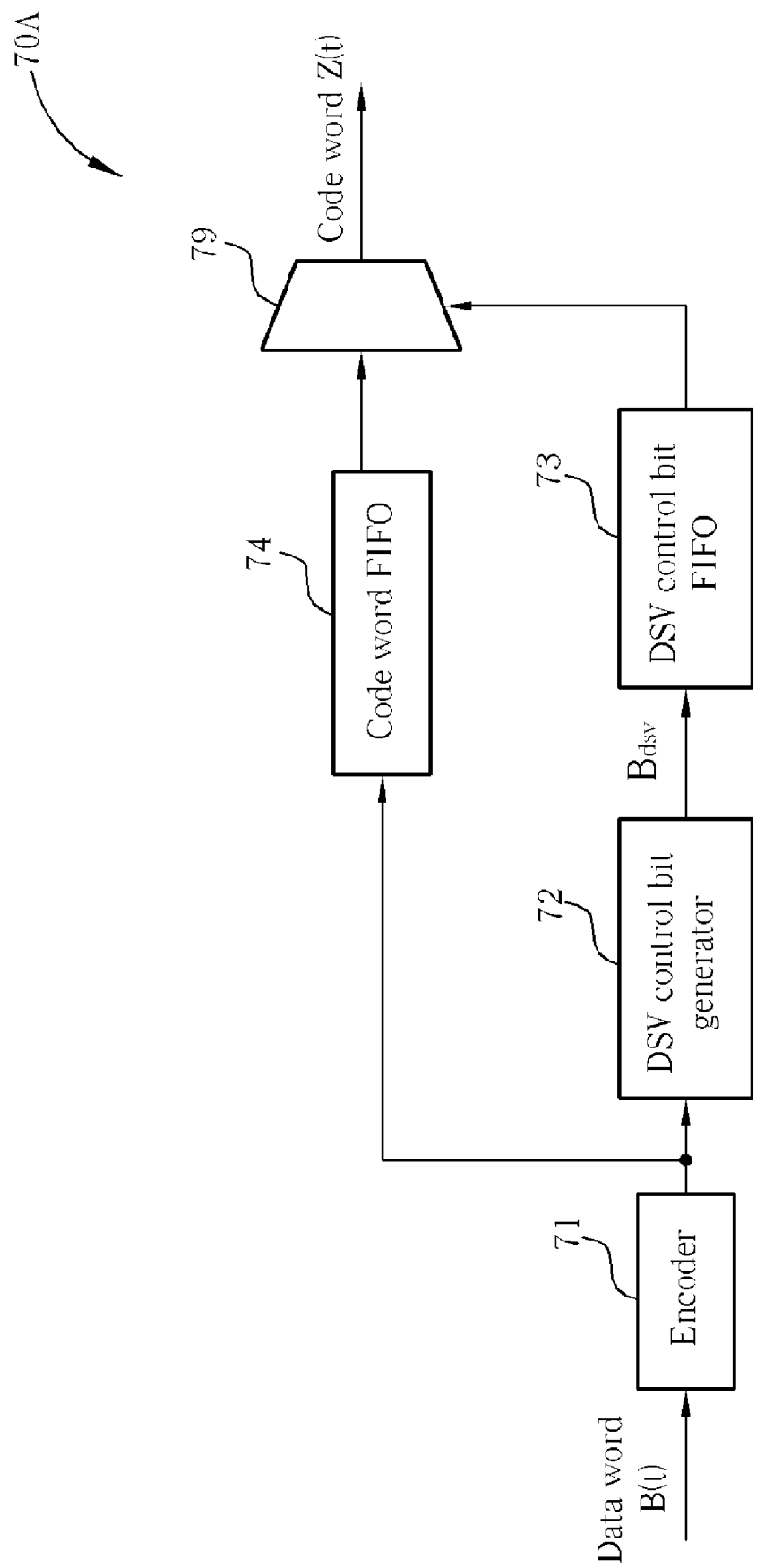

FIG. 8 shows another embodiment of a modulation system 70. In this embodiment, a DSV control bit generator 72 determines the DSV control bits according to tentative code words encoded by an encoder 71. The tentative code words are sequentially stored in a code word FIFO 74. A final code word generator 75 inserts the determined DSV control bits sequentially stored in a DSV bit FIFO 73 into corresponding code words read from the code word FIFO 74. In some other embodiments, the final code word generator 75 modifies the original DSV control bit of the tentative code words with the DSV control bit stored in the DSV control bit FIFO 73.

Figure 9:
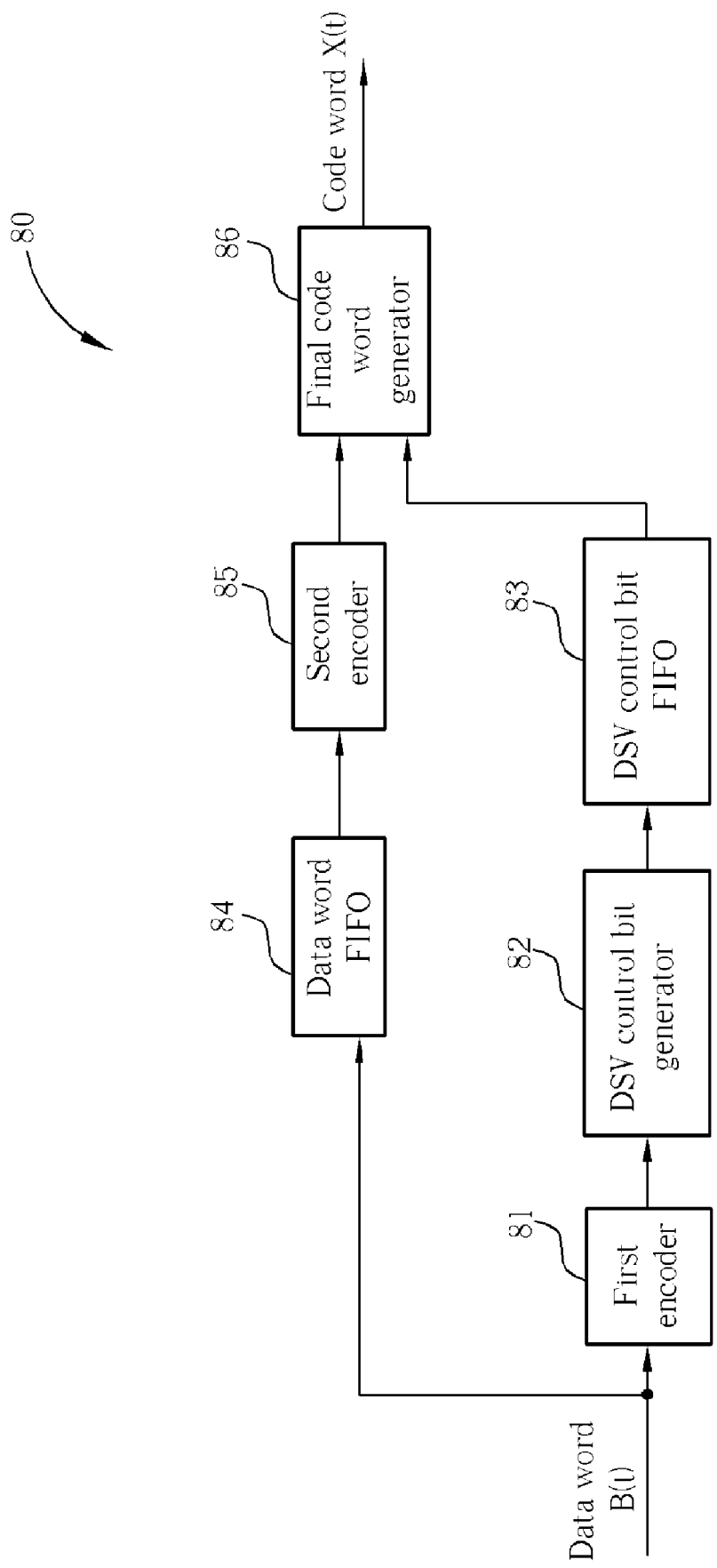
Figure 9A:
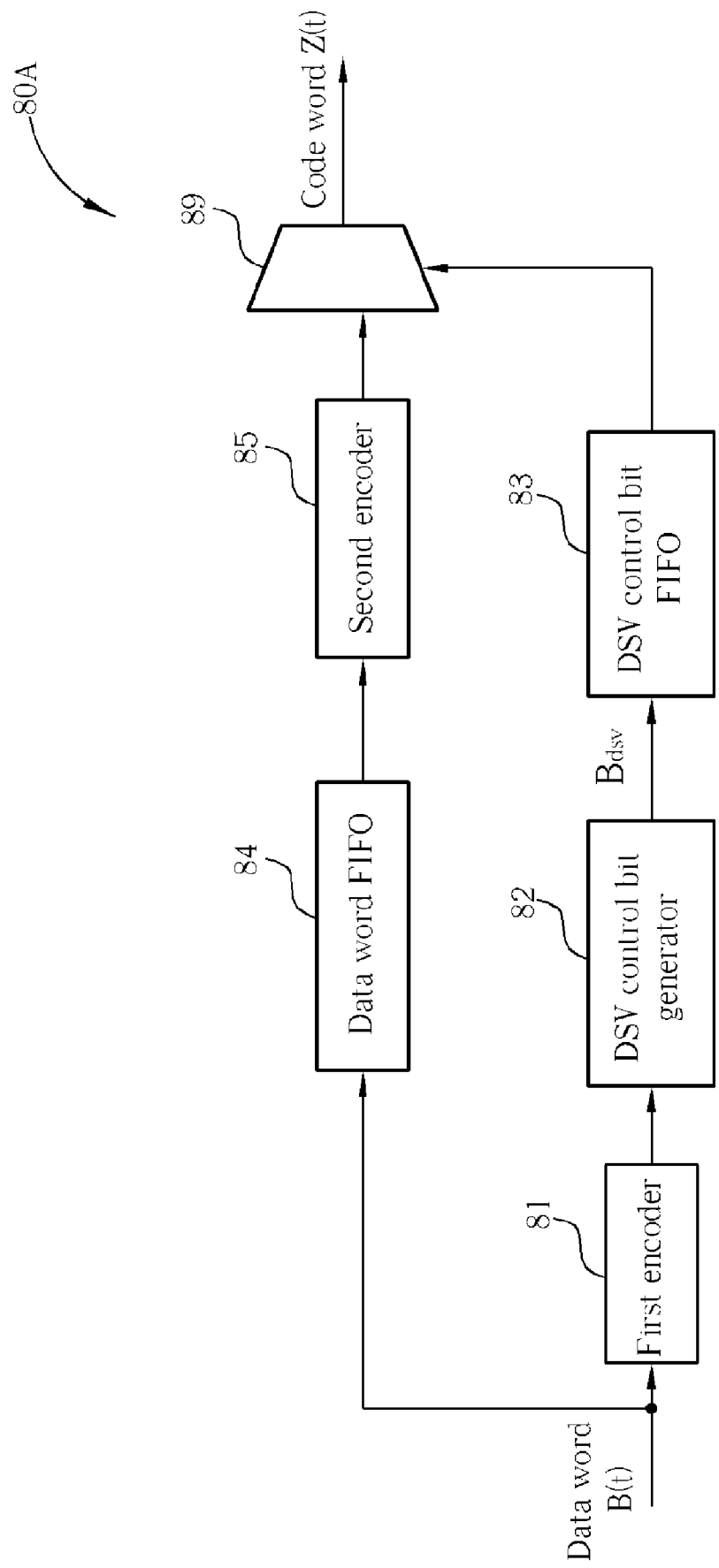

In comparison with the modulation system 70, the modulation system 80 in FIG. 9 further comprises a second encoder 85, so that the buffer 84 may store data words instead of code words, consequently, reducing the memory size required by the data word FIFO 84. The capacity for storing data words is less than the capacity for storing code words, for example, in an HD-DVD recording system, there are eight bits in a data word, but twelve bits in a code word. A DSV control bit generator 82 determines DSV control bits according to tentative code words encoded by a first encoder 81, and outputs the determined DSV control bits to a DSV bit FIFO 83. The second encoder 85 modulates the data words stored in the data word FIFO 84 into tentative code words. The determined DSV control bits output from the DSV control bit FIFO 83 are combined into corresponding tentative code words by a final code word generator 86.

Since the input of the DSV control bit generator 72 in the modulation system 70 and the input of the DSV control bit generator 82 in the modulation system 80 are tentative code words Y(t), which is the same as that in modulation system 20, one embodiment of the DSV control bit generator 72 and the DSV control bit generator 82 could be the same as the DSV control bit generator 151 in the modulation system 20 as shown in FIG. 5.

Figure 10:
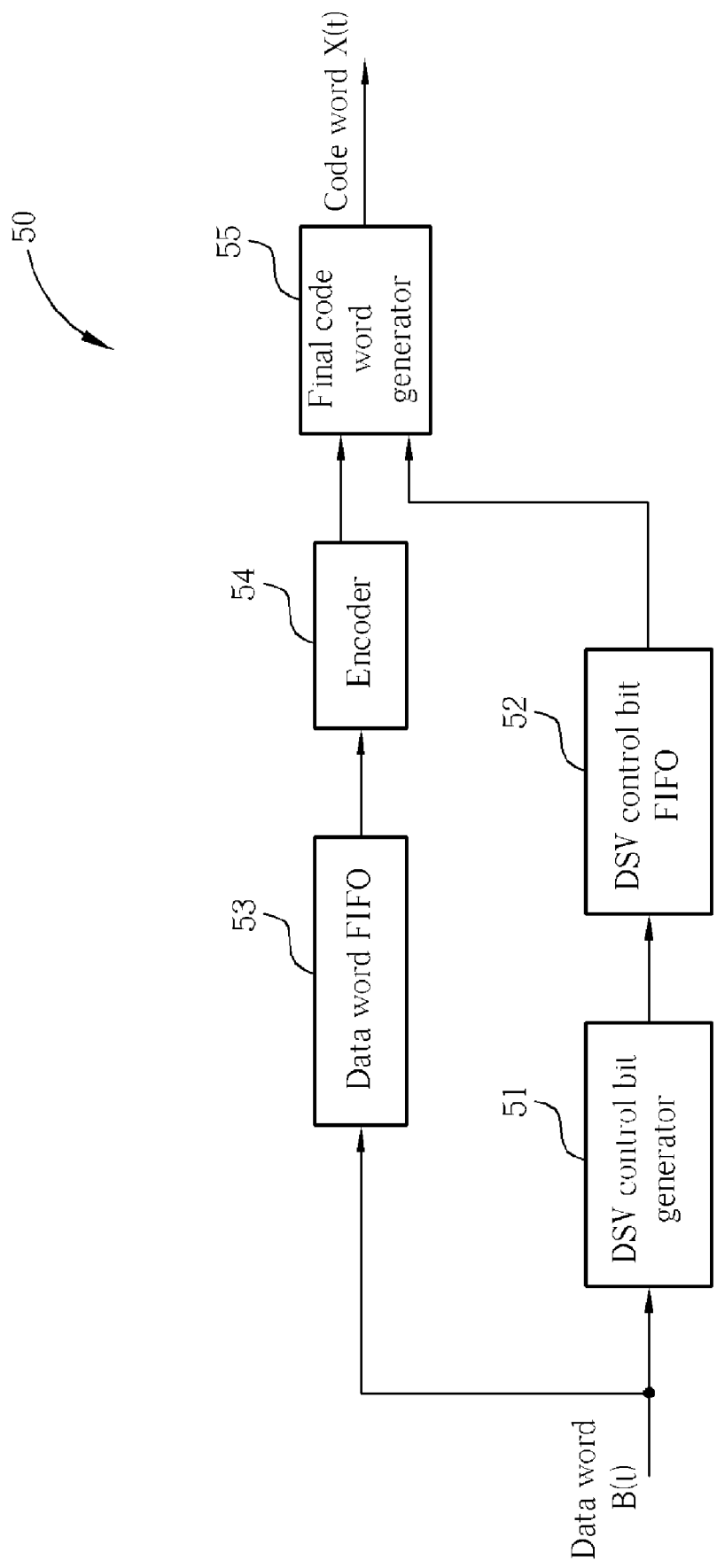
Figure 10A:
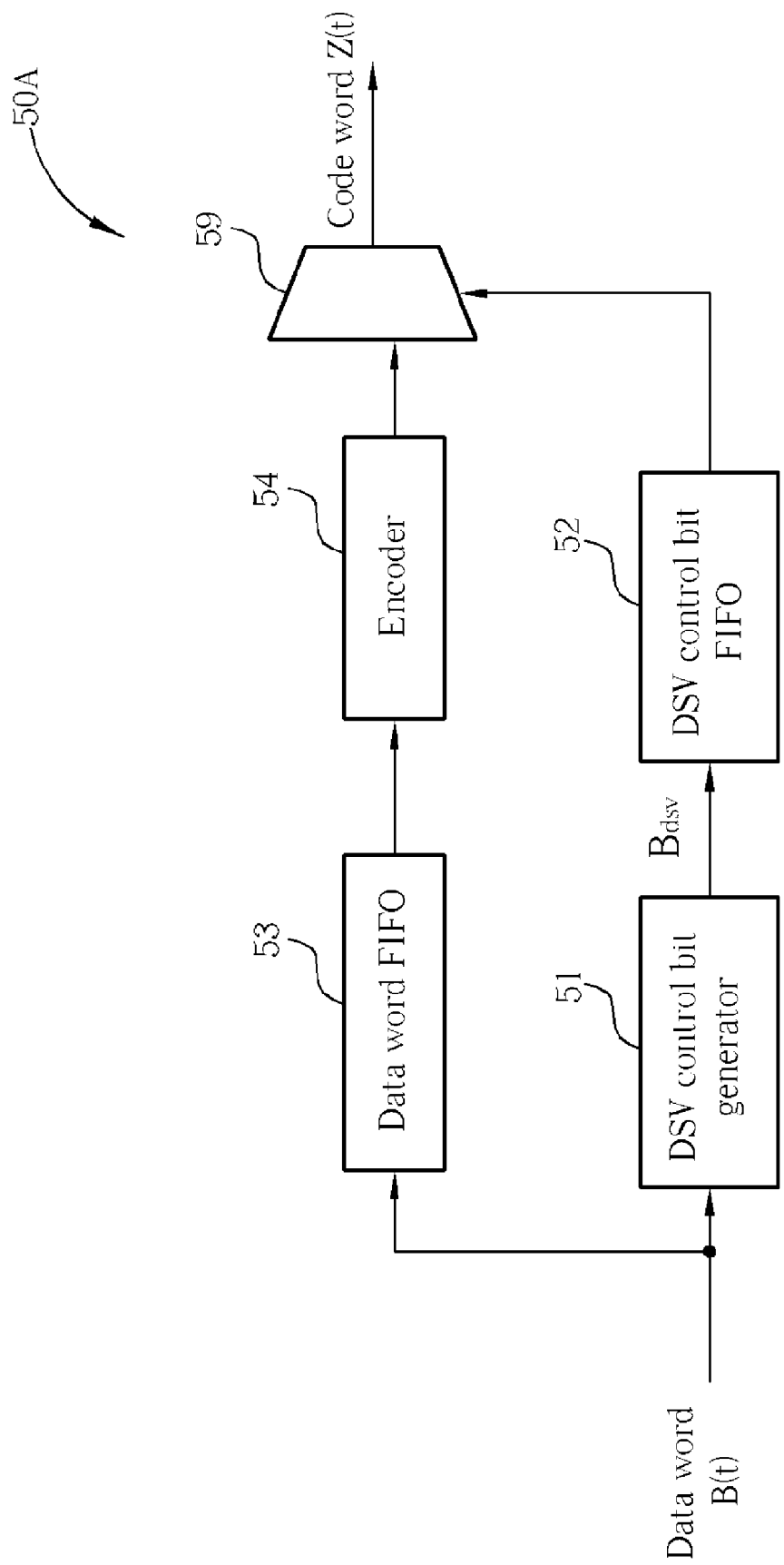

FIG. 10 is a block diagram showing an embodiment of a modulation system 50. Data words B(t) are provided to a DSV control bit generator 51 and a data word FIFO 53. By utilizing the data word FIFO 53 to store data words B(t) instead of code words, the buffer size of the data word FIFO 53 is reduced. The data word FIFO 53 then provides the data words B(t) to an encoder 54 to transform the data words into code words with undetermined DSV control bits, or so called tentative code words. The DSV control bit generator 51 determines a current DSV control bit to minimize (optimize) the absolute cumulative DSV when detecting at least one subsequent DSV control bit. The determined current DSV control bit is temporarily stored in a DSV control bit FIFO 52, and then is read out from the DSV control bit FIFO 52. A final code word generator 55 modifies the DSV control bit in the tentative code word according to the current DSV control bit stored in the DSV control bit FIFO 52. By storing the DSV control bit in the DSV control bit FIFO 52, the DSV control bit can be accessed and controlled more easily. In other embodiments, the DSV control bit generator 51 can also use a mapping table to determine the DSV control bit based on the data word. By using a mapping table, the cumulative DSV can be calculated by searching for corresponding values using the data words.

Figure 11:
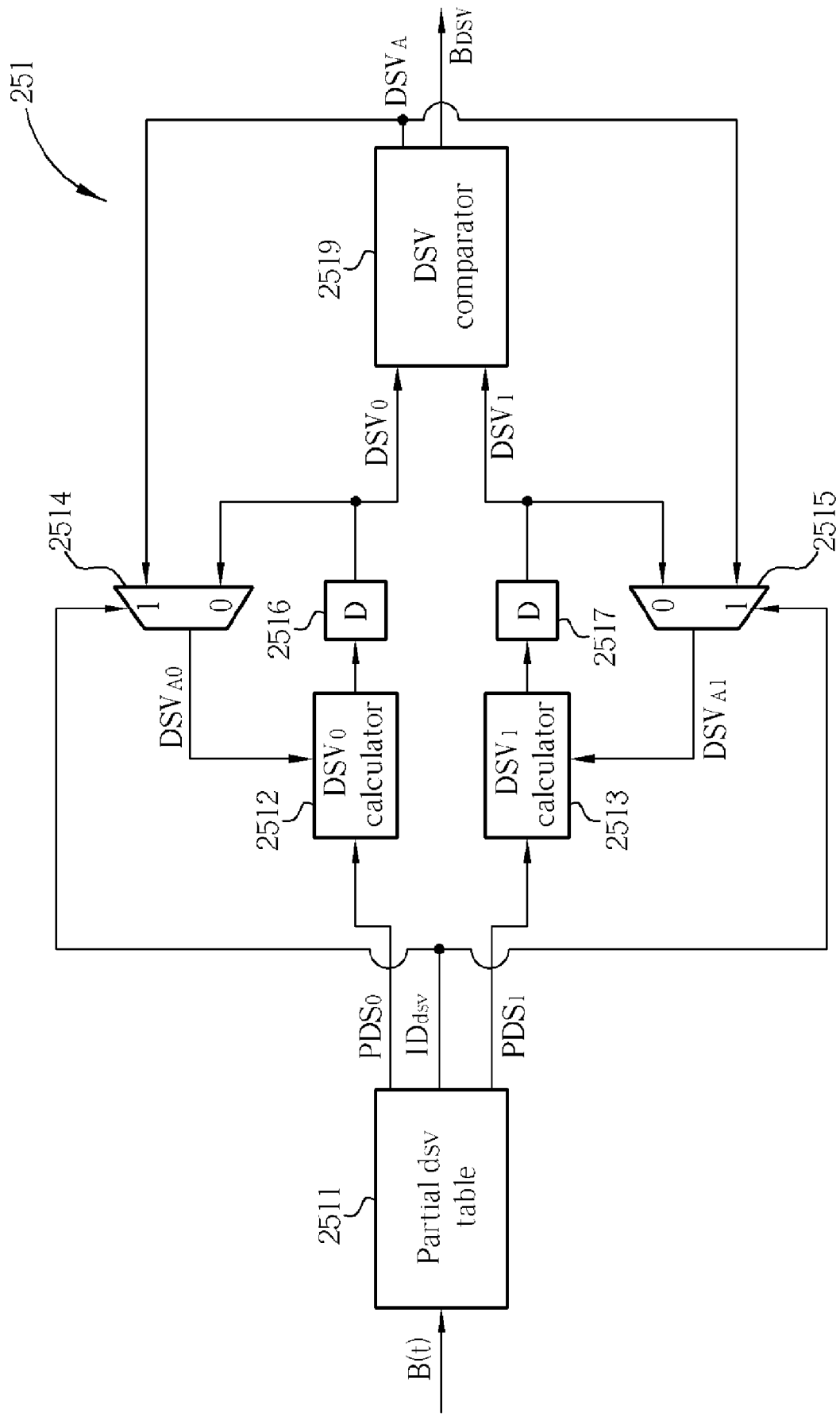
FIG. 11 is a block diagram showing an embodiment of the DSV control bit generator in FIG. 10.

FIG. 11 is a block diagram showing an embodiment 251 of the DSV control bit generator 51 in FIG. 10. Elements 2512-2519 in the DSV control bit generator shown in FIG. 11 are the same as elements 1512-1519 in FIG. 5, thus the description of elements 2512-2519 are omitted. The detailed description of the partial DSV table 2511 will be explained as follows. Since the input of the DSV control bit generator 51 is a signal carrying data words B(t), a partial DSV table 2511 simultaneously maps two partial DSVs, $PSD_0$ and $PSD_1$, and a DSV control bit indicator $ID_{DSV}$ according to the data word B(t). A portion of an exemplary partial DSV table 2511 is shown in FIG. 12. If the data word B(t) does not have any DSV control bit, the value of the DSV control bit indicator $ID_{DSV}$ is 0, and the two partial DSVs, $PSD_0$ and $PSD_1$, generated by the partial DSV generator 1511 are the same. If the data word B(t) has a DSV control bit, the value of the DSV control bit indicator $ID_{DSV}$ is 1, and the two partial DSVs, $PSD_0$ (assuming the current DSV control bit $B_{DSV}=0$) and $PSD_1$ (assuming the current DSV control bit $B_{DSV}=1$), are generated by the partial DSV generator 1511, respectively. Besides, the bit asterisk "*" and code connection rules are also taken into consideration for determination of DSV control bit. An offset value will be added to the partial DSVs when the bit asterisk "*" and code concatenation rules are encountered. The offset value is determined according to the previous, current, and subsequent data words.

Figure 13:
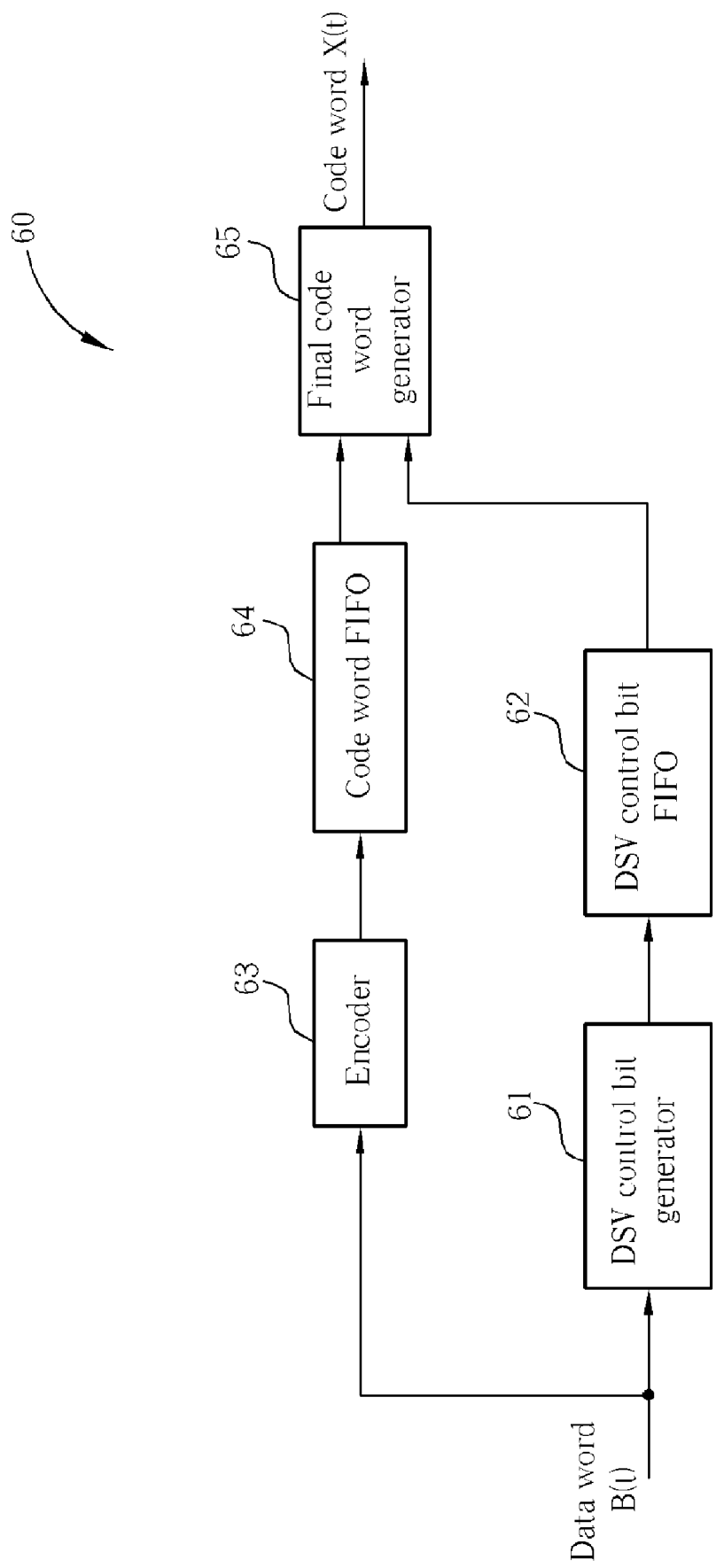
FIGS. 13-14 are functional block diagrams showing embodiments of modulation systems.
Figure 13A:
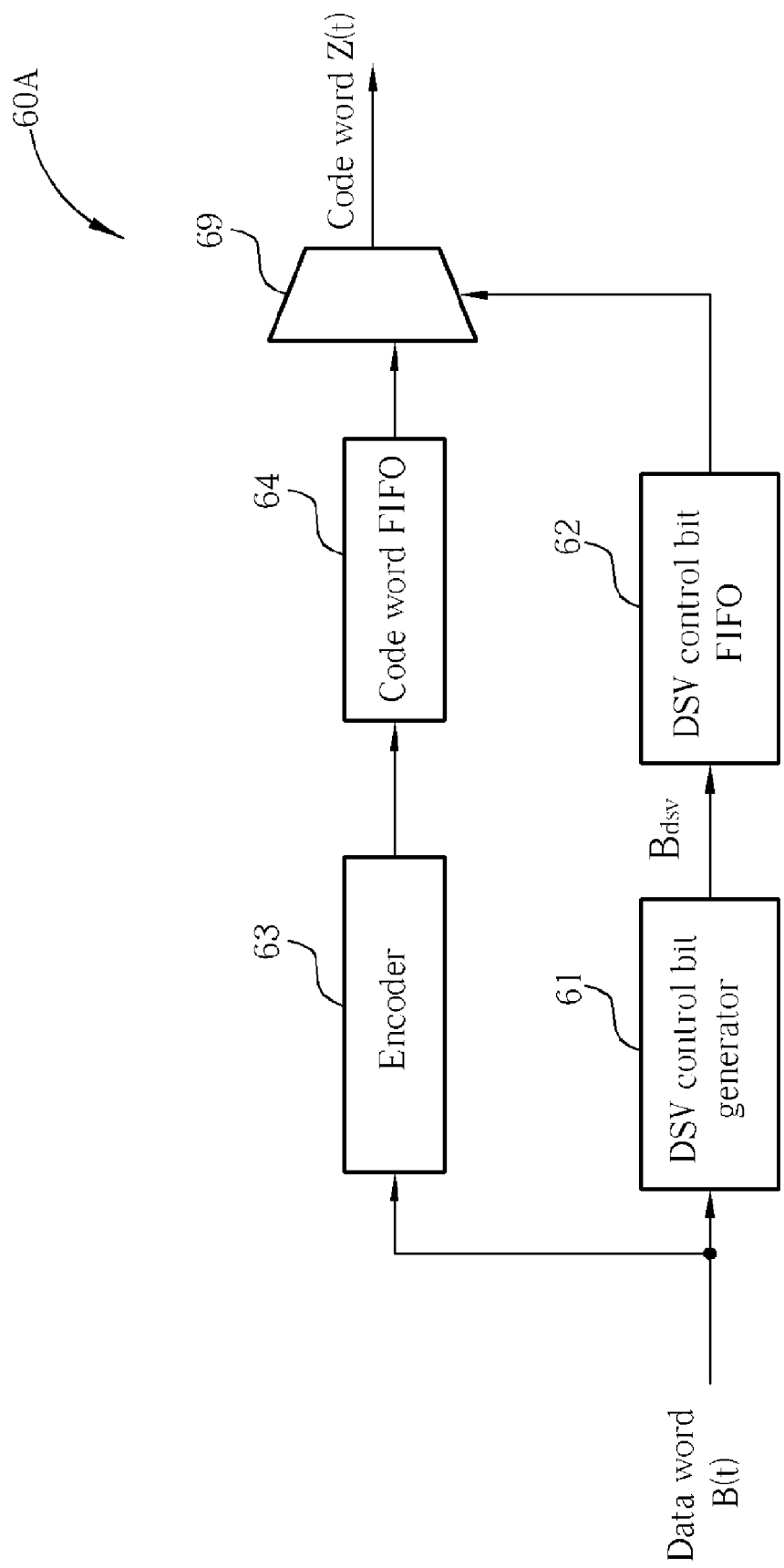

FIG. 13 is a block diagram showing another embodiment of a modulation system 60. In comparison with the modulation system 50, the modulation system 60 encodes the data words B(t) into code words through an encoder 63, and instead of storing the data words, the system 60 stores the code words with undetermined DSV control bits in a code word FIFO 64. Similarly, the data words are provided to a DSV control bit generator 61 for determining DSV control bits, and the determined DSV control bits are temporarily stored in a DSV control bit FIFO 62 waiting to be retrieved by a final code word generator 65. Since the input of the DSV control bit generator 61 in the modulation system 60 is a stream of data words B(t), which is the same as that in the modulation system 50 of FIG. 10, one embodiment of the DSV control bit generator 61 could be the same as the DSV control bit generator 51 in the modulation system 50 as shown in FIG. 11.

FIGS. 8(A), 9(A), 10(A), and 11(A) are based on FIGS. 8, 9, 10, and 11. In these embodiments 70A, 80A, 50A, 60A, a DSV control bit generator determines the DSV control bits according to data words or code words and sequentially outputs the determined DSV control bits to a DSV control bit FIFO. An encoder in the modulation system of these embodiments encodes each data word B(t) into one or more than one different tentative code words depending on whether any DSV control bit exists in the tentative code words. If no DSV control bit exists in the tentative code words, the tentative code words corresponding to a data word B(t) are the same. If a DSV control bit exists in the tentative code words, two different tentative code words corresponds to a data word B(t) are generated for each possible DSV control value. If two DSV control bit exists in the tentative code words, four different tentative code words corresponds to a data word B(t) are generated for each possible value of the two DSV control bits. Finally, the determined DSV control bits output from the DSV control bit FIFO select the corresponding tentative code words as the post-DSV code word Z(t) through a multiplexer 79, 89, 59, 69.

Figure 14:
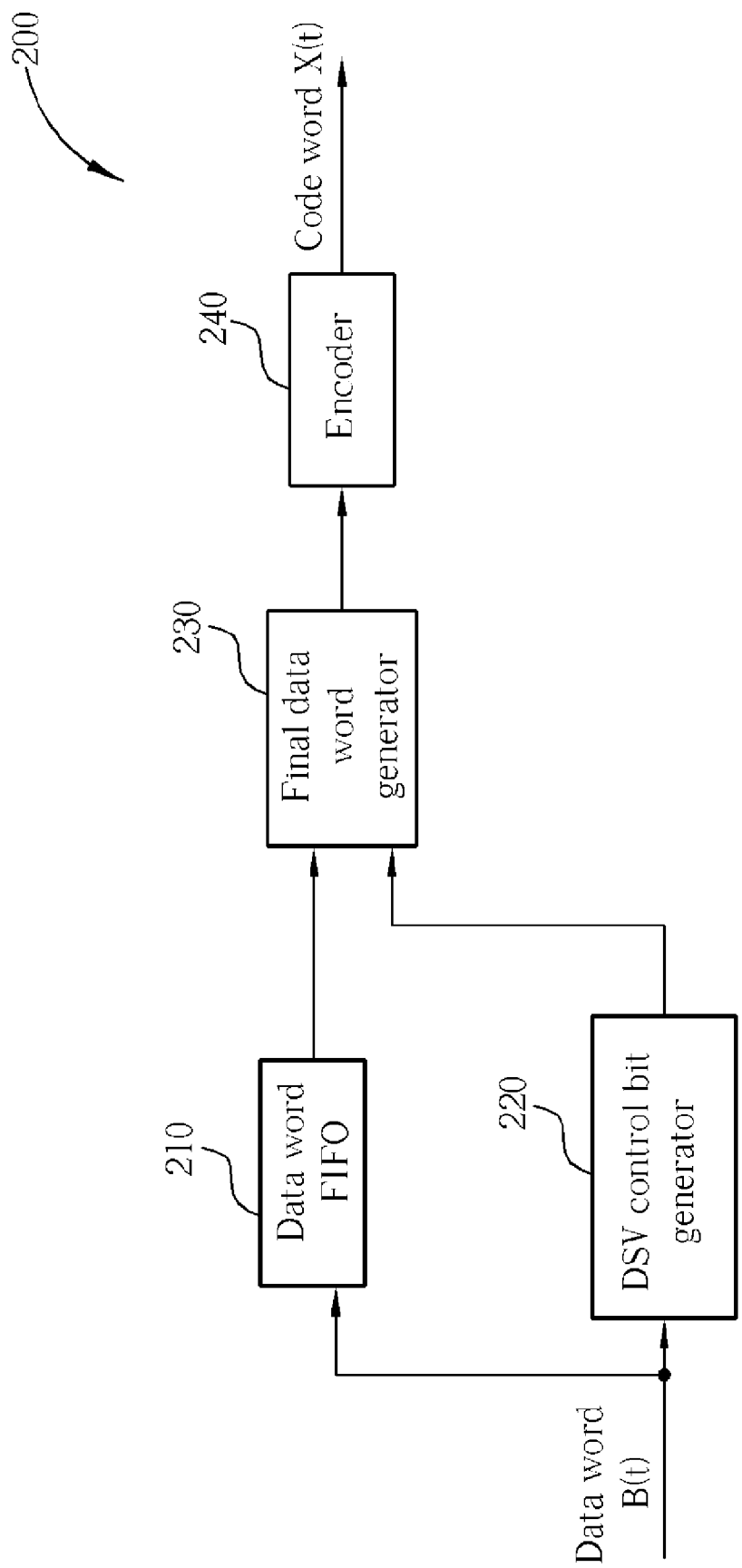
Figure 15:
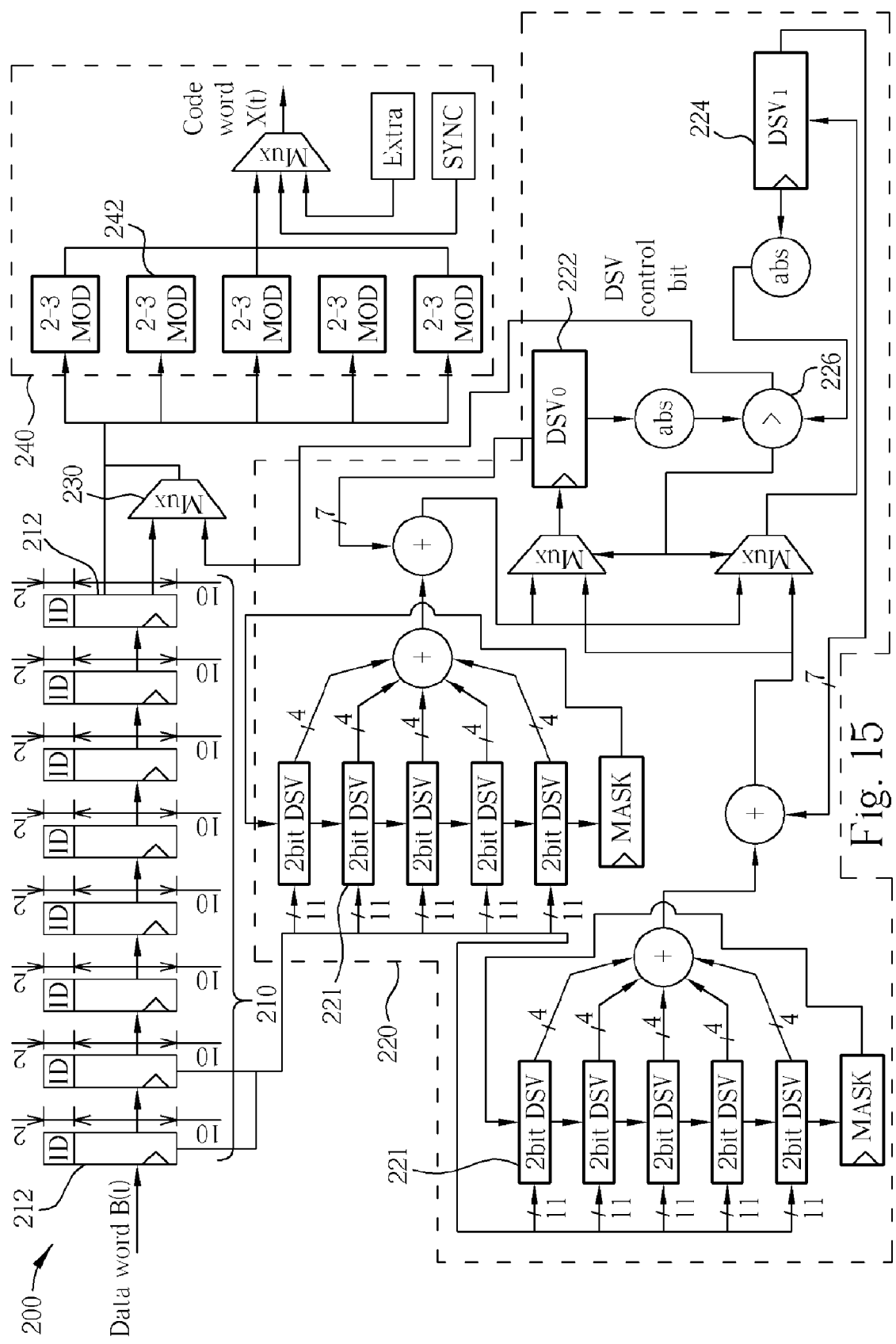
FIG. 15 is a detailed diagram of the embodiment shown in FIG. 14.

For a Blu-ray disc (BD) system, 17PP modulation is used to convert a data word to a code word from 2-bit to 3-bit. Please refer to FIGS. 14 and 15, which illustrate a 17PP modulator 200 for use with a Blu-ray disc recorder. A data word B(t) is simultaneously input to a DSV control bit generator 220 and a data word FIFO 210. The data word FIFO 210 stores a plurality of data words 212, where each data word 212 contains a 2-bit ID and 10 bits of data. The 2-bit ID indicates whether a DSV control bit is present in the corresponding 10 bits of data and the location of the DSV control bit. The DSV control bit generator 220 determines a current DSV control bit by calculating two cumulative DSV values 222 and 224 corresponding to a DSV control bit of 0 and 1. The absolute values of the two calculated DSV values 222 and 224 are compared with a comparator 226 to determine which control bit produces the smallest DSV value. In other words, the DSV control bit generator 220 minimizes (optimizes) the absolute cumulative DSV by parallel processing several 2-bit channel bits 221 when detecting at least one subsequent DSV control bit or after a predetermined delay. The buffer size of the data word FIFO 210 determines the predetermined delay used for detecting the DSV control bit since the number of data words that the data word FIFO 210 can store depends on the buffer size of the data word FIFO 210.

In other embodiments, the DSV control bit generator 220 can also use a mapping table to determine the DSV control bit based on the data word. FIG. 16 represents an example of the so-called mapping table that converts data words to partial DSVs. The length of data words in FIG. 16 is not constant, so that the effect of a 2-bits data word may have already been calculated in the previous operation of transferring a data word to the DSV value according to the mapping table in FIG. 16. The effect of a 2-bits data word to the DSV should be ignored if it had been calculated in the previous operation, otherwise the effect should be added into the DSV calculation. The MASK signal is used to indicate whether a 2-bits data word is effective or not. By using a mapping table such as the tables previously mentioned, the cumulative DSV can be calculated by searching for corresponding values using the data words. Afterward, the original DSV control bit of a data word is modified by the DSV control bit determined by the DSV control bit generator 220 by a final data word generator 230, which is shown as a multiplexer in FIG. 15. The data words combined with the determined DSV control bit are modulated into code words X(t) by an encoder 240 in parallel. The parallel modulation utilizes a plurality of modulators 242, and means that several 2-bit channel bits of the data word B(t) are simultaneously converted into 3-bit modulated bits of the code words X(t). FIG. 17 shows an example implementation of the encoder 240 for the conversion from data word to code word.

Figure 18:
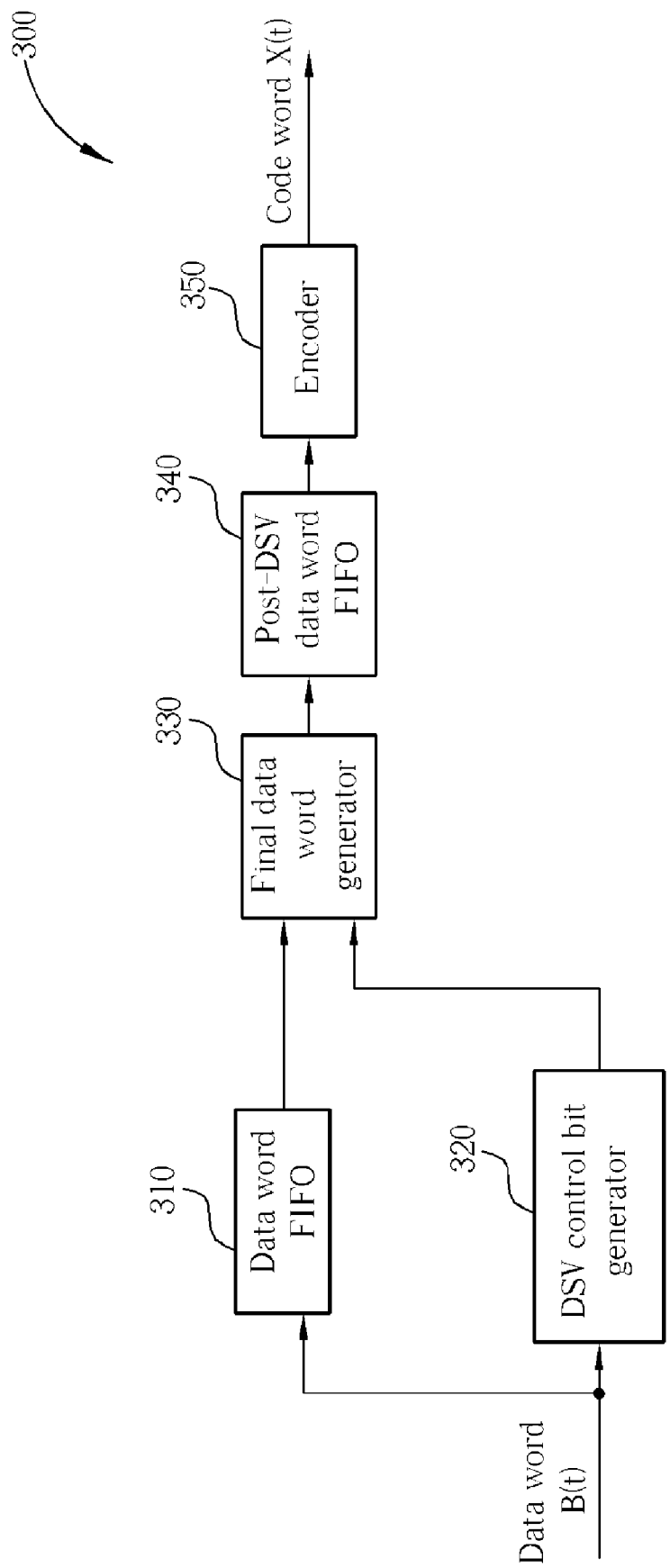
FIG. 18 is a functional block diagram showing an embodiment of a modulation system.
Figure 19:
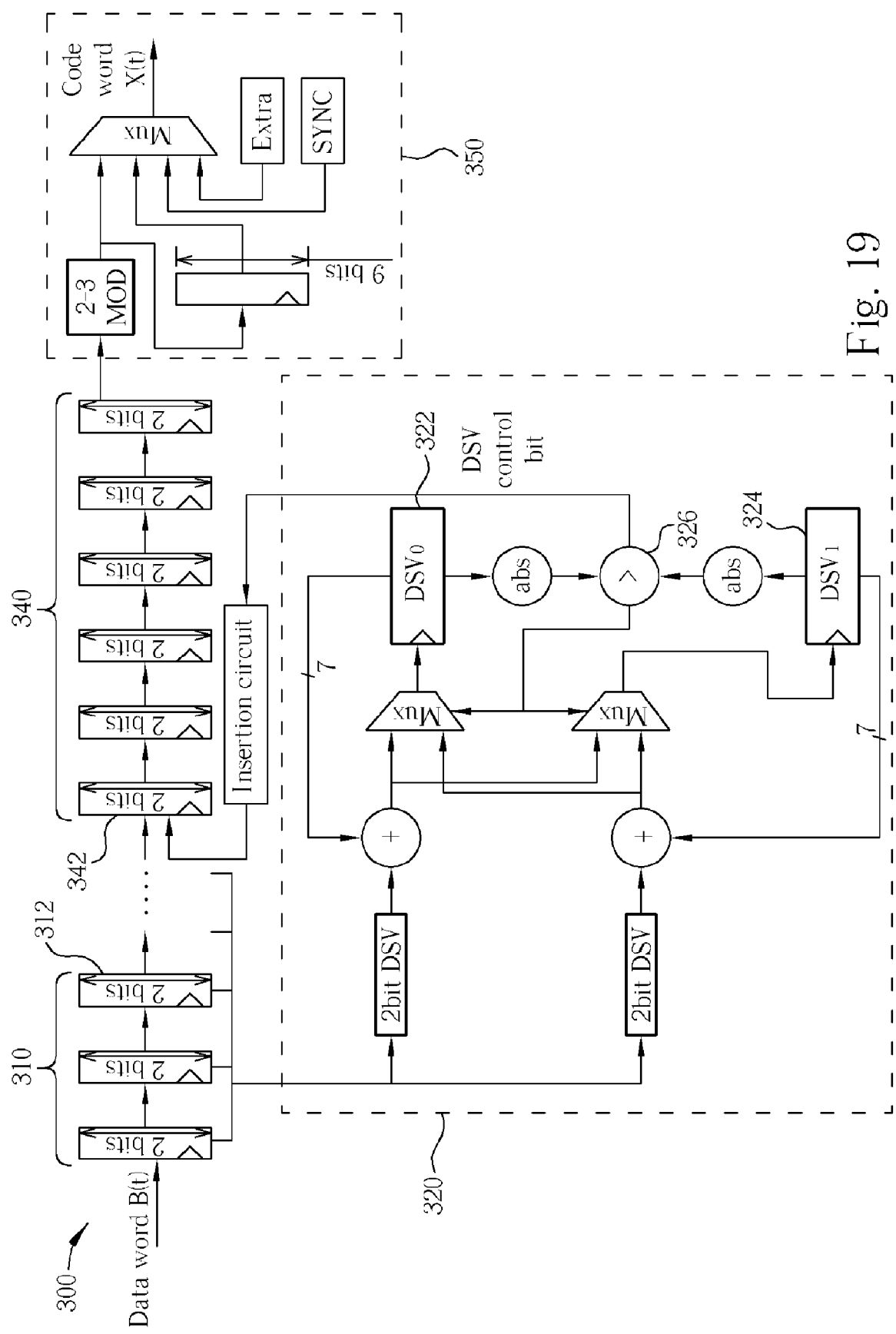
FIG. 19 is a detailed diagram of the embodiment shown in FIG. 18.

Please refer to FIGS. 18 and 19, which illustrate a 17PP modulator 300 for serial processing data. As shown in FIG. 18, a data word B(t) is simultaneously input into a DSV control bit generator 320 and a data word FIFO 310. The data word FIFO 310 stores a plurality of sequential 2-bit channel bits 312 of the data word B(t). The DSV control bit generator 320 determines a current DSV control bit by calculating two cumulative DSV values 322 and 324 corresponding to a DSV control bit of 0 and 1. The absolute values of the two calculated DSV values 322 and 324 are compared with a comparator 326 to determine which control bit produces the smallest DSV value. In other words, the DSV control bit generator 320 minimizes (optimizes) the absolute cumulative DSV by serially processing sequential 2-bit channel bits 321 when detecting at least one subsequent DSV control bit. Afterward, a determined DSV control bit is inserted into a corresponding data word by a final data word generator 330. The data words combined with the determined DSV control bit are temporally buffered in a post-DSV data word FIFO 340. An encoder 350 serially reads the data words 342 from the post-DSV data word FIFO 340 for encoding them into code words X(t) channel-bit to channel-bit.

Figure 20:
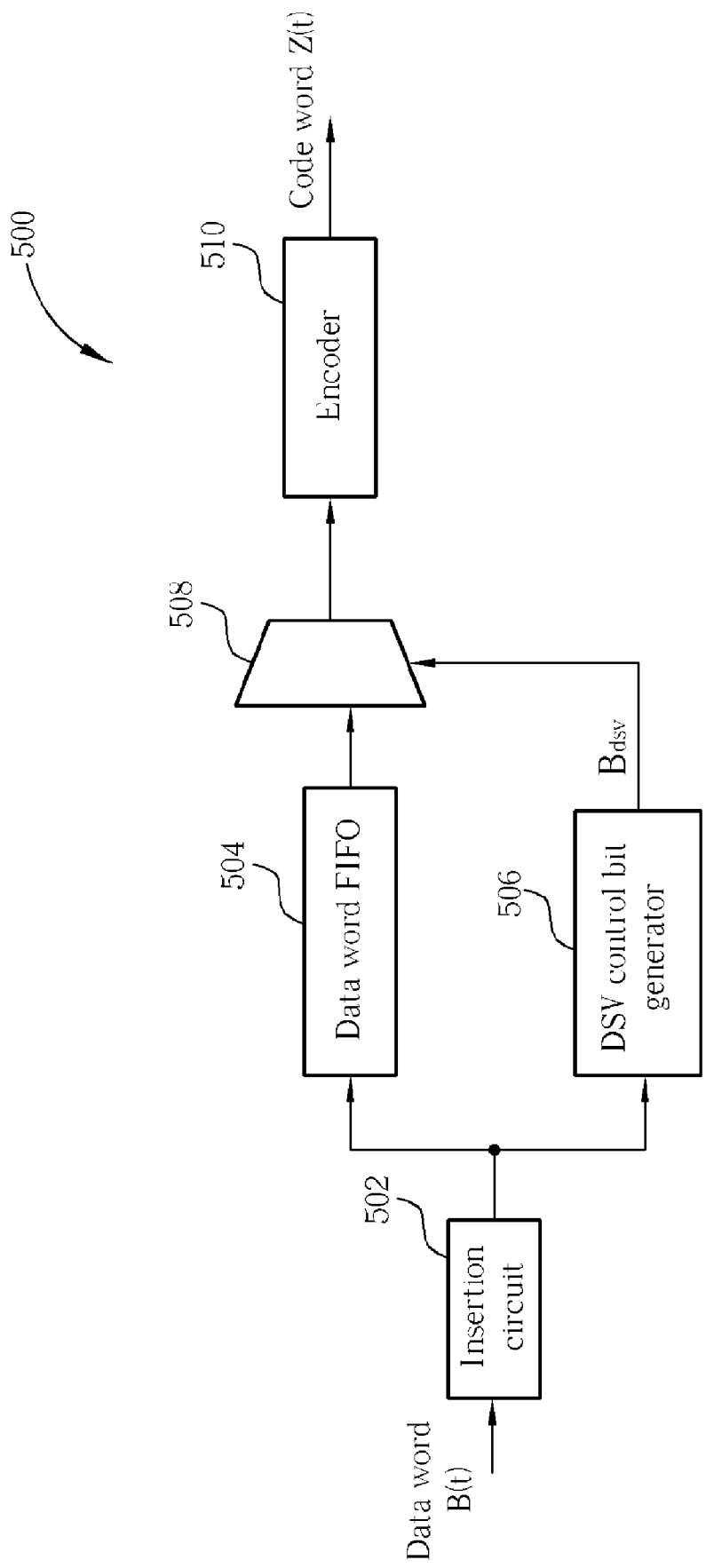
FIGS. 20 to 21 are functional block diagrams showing embodiments of modulation systems.
Figure 21:
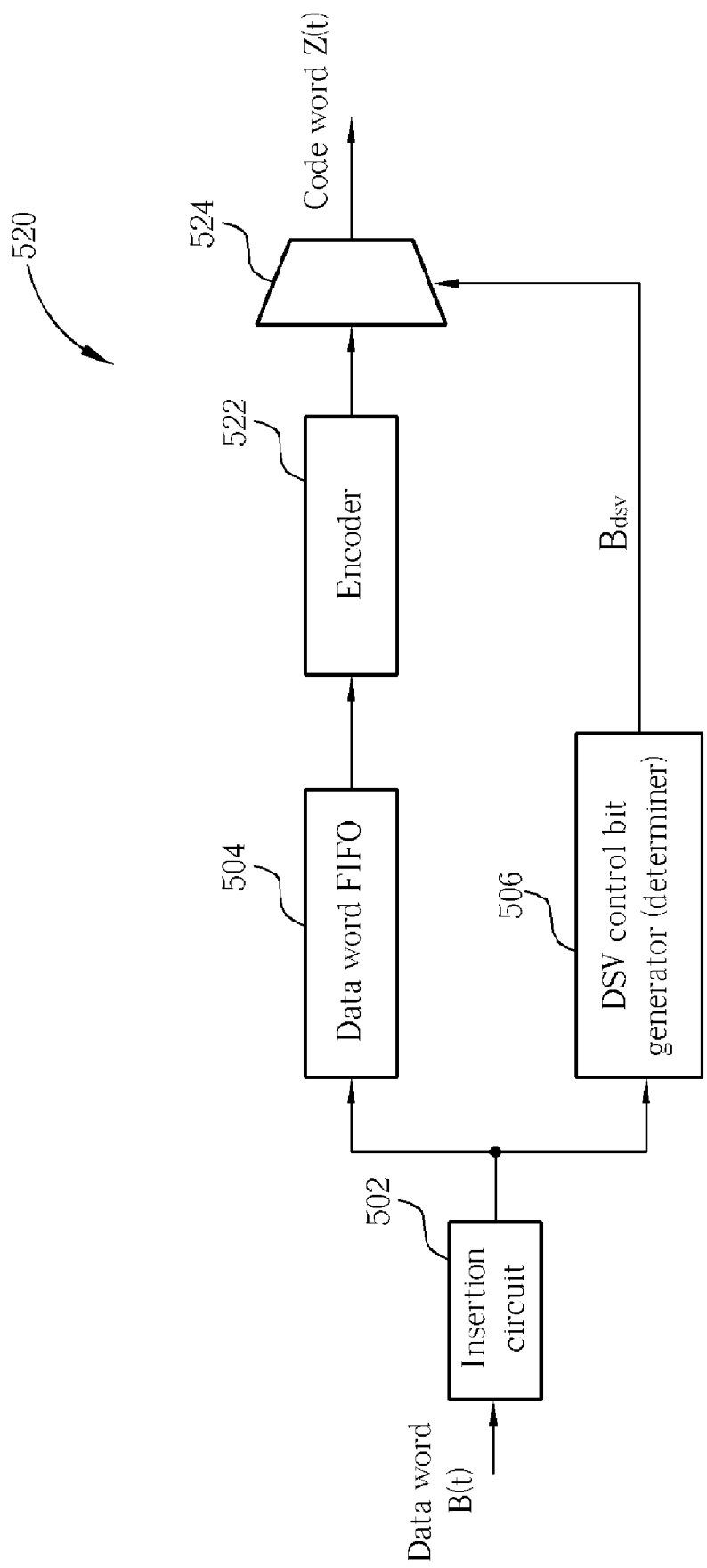

Please refer to FIG. 20 and FIG. 21, which illustrate embodiments 500, 520 of modulation systems. The embodiments 500, 520 can make use of either serial or parallel implementations, such as the parallel implementation shown in FIG. 14 and the serial implementation shown in FIG. 18.

In these embodiments, an insertion circuit 502 inserts each DSV control bit into the corresponding positions within the stream of the data words. Because each DSV control bit has two possible values, 0 and 1, two different streams of data words corresponding to each possible value of a DSV control bit are produced after the insertion circuit 502. The two different streams of data words are provided to a data word FIFO 504 and a DSV control bit generator (determiner) 506 for determining each DSV control bit within the two different streams of data words. In the embodiment of FIG. 20, the determined DSV control bit selects a corresponding data word stream for encoding. The DSV control bit selects the corresponding data word through a multiplexer 508, and an encoder 510 encodes the result. In the embodiment of FIG. 21, an encoder 522 modulates the two streams of data words stored in the data word FIFO 504 into two respective streams of code words. Then, the determined DSV control bit uses multiplexer 524 to select a corresponding stream of code words as the post-DSV code word Z(t).

Figure 22:
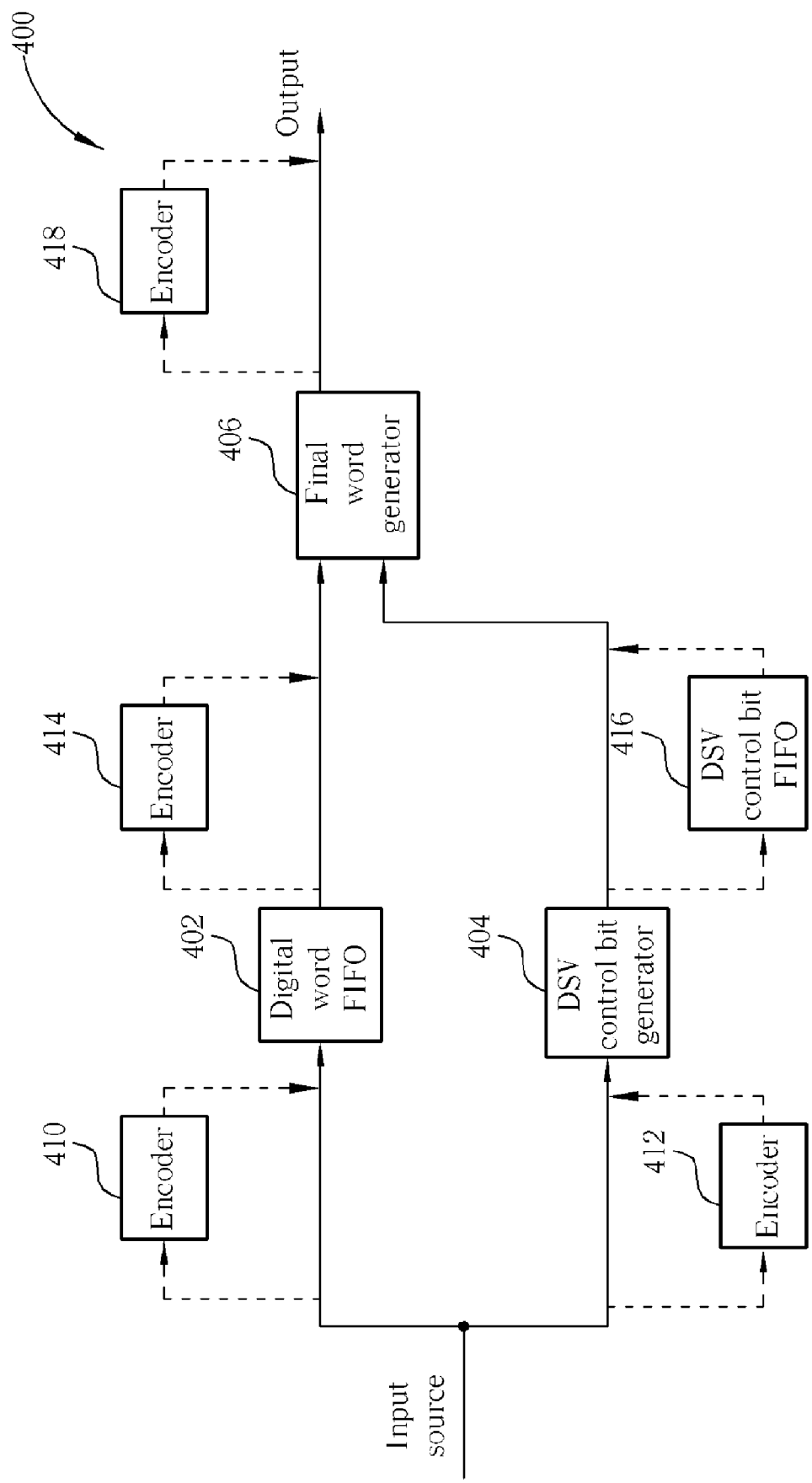
FIG. 22 is a summarized structural diagram of a modulation system.

Please refer to FIG. 22, which is a summarized structural diagram of a modulation system 400 according to the above disclosure. In the modulation system 400, blocks 402-406 represent required blocks and blocks 410-418 represent optional ones. A digital word FIFO 402 may store either data words or tentative code words, and the input source may be data words or tentative code words. Similarly, the source of the DSV control bit generator 404 may be data words or tentative code words. Final word generator 406 may generate either final data words or final code words as output by either modifying, replacing, inserting, or selecting the final word according to DSV control bits determined by the DSV control bit generator 404.

For the optional units, one or more encoders 410, 412, 414, 418 may be placed in many possible positions, and it is also possible that multiple encoders are included in the system. A DSV control bit FIFO 416 can be included in some embodiments, whereas in some other embodiments, the DSV control bit may be directly transferred to the final word generator 406 without the FIFO, for example, by knowing where to insert/ modify the DSV control bit by calculating its position.

For a compact disc (CD), merge bits are placed between every pair of symbols in a CD frame. The merge bits consist of three bits, and the three bits can be carefully chosen in order to reduce the absolute cumulative DSV.

Figure 23:
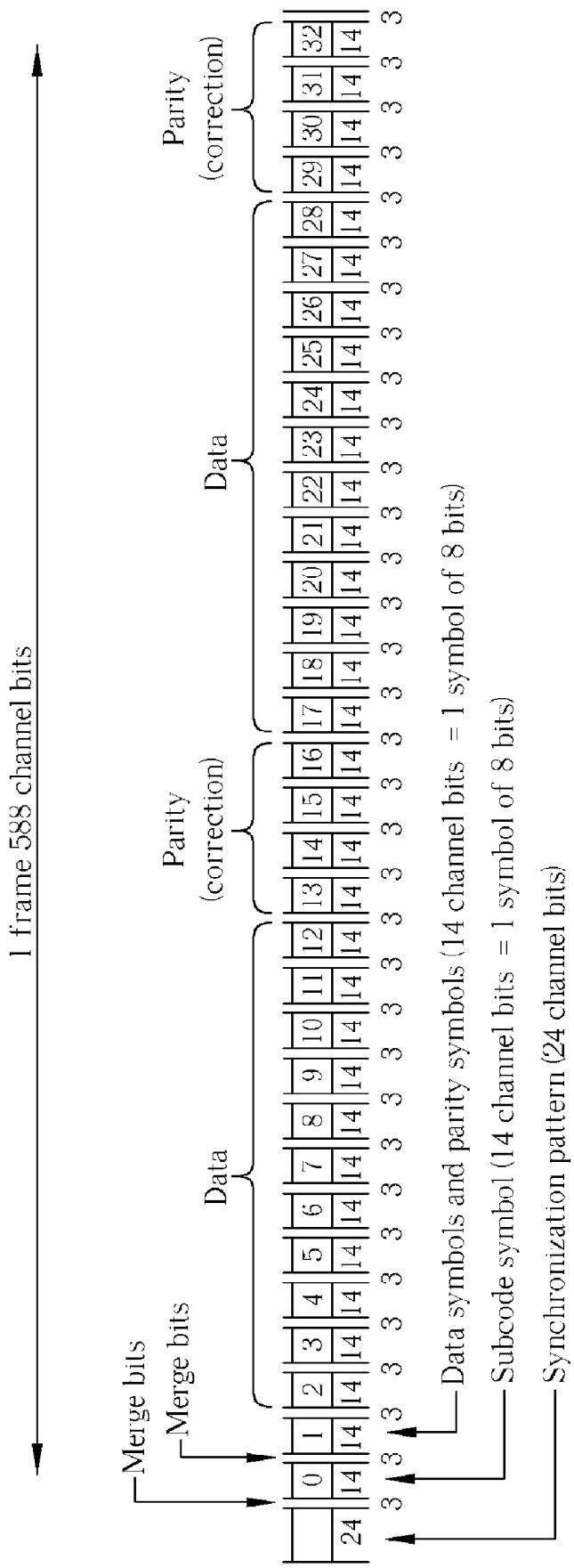
FIG. 23 illustrates the contents of a CD frame after modulation.

Please refer to FIG. 23. FIG. 23 illustrates the contents of a CD frame after modulation. The CD frame contains 34 symbols. The frame first has one 24-bit sync pattern, which is followed by one 14-bit subcode symbol. The remaining part of the frame contains 32 14-bit data symbols. The 32 14-bit data symbols contain data as well as parity information that is used for providing correction information for the data in the CD frame. In addition, a 3-bit combination of merge bits is placed after each symbol. As shown in FIG. 23, there are a total of 34 3-bit merge bit combinations in the CD frame. For CDs, selecting which 3-bit merge bits should be inserted between successive symbols can affect the absolute cumulative DSV in a way similar to how the selection of DSV control bits can affect the absolute cumulative DSV for DVDs.

Figure 24:
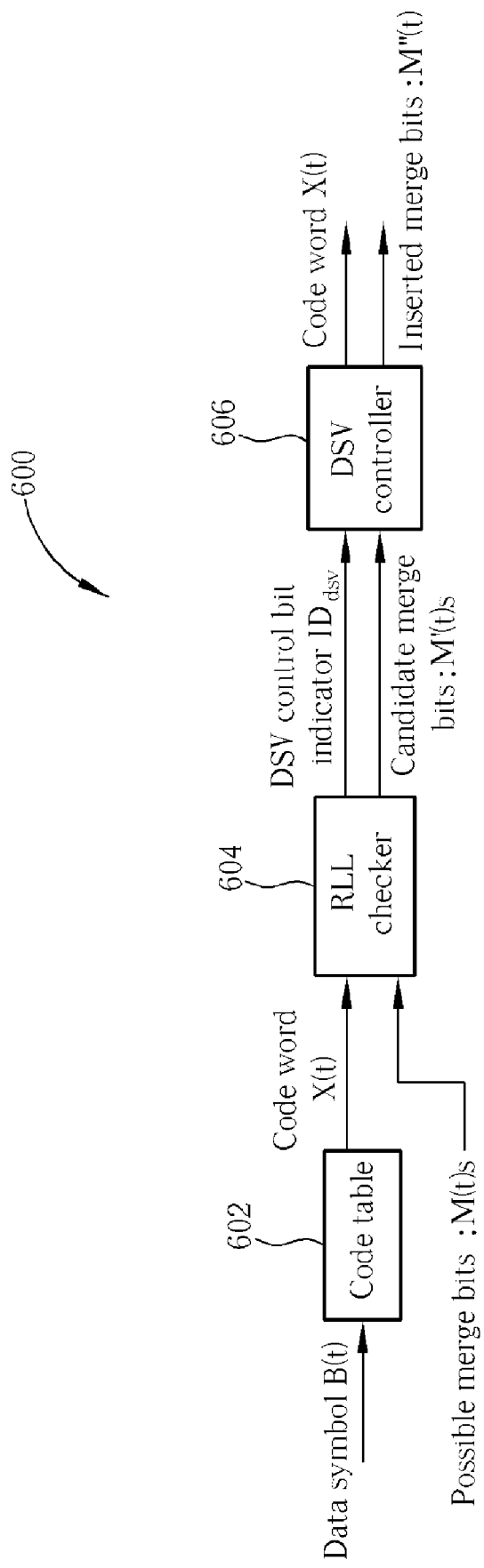
FIG. 24 shows a modulation system 600 for compact discs.

Please refer to FIG. 24. FIG. 24 shows a modulation system 600 for compact discs. The modulation system 600 comprises a code table 602, a Run Length Limited (RLL) checker 604, and a DSV controller 606. A series of 8-bit data symbols B(t) are supplied to the code table 602. The code table 602 translates each 8-bit data symbol B(t) into a 14-bit code word X(t) using eight-to-fourteen modulation (EFM).

Following the EFM performed by the code table 602, merge bits need to be inserted between each symbol of the CD frame. To accomplish this, the RLL checker 604 receives all of the possible merge bits M(t)s that could possibly be used as merge bits. These possible merge bits include the following merge bit combinations: 000 (even polarity), 001 (odd polarity), 010 (odd polarity), 100 (odd polarity), and 101 (even polarity, invalid). The combination 101 is not a valid combination of merge bits under the RLL(2-10) rule, which stipulates that binary ones in the channel bits are separated by a minimum of two zeroes and a maximum of ten binary zeroes. However, the combination 101 can be used under a modified RLL rule (MRLL) indicated as MRLL(1-10), which stipulates that binary ones in the channel bits are separated by a minimum of one zero and a maximum of ten binary zeroes. In this way, the combination of 101 can be used to provide an additional combination of bits having even polarity since without it there was only one other combination (000) having even polarity whereas there were three combinations (001, 010, 100) having odd polarity.

For deciding which of the possible merge bits M(t)s can be candidate merge bits M'(t)s for insertion between two symbols, the RLL checker 604 analyzes the previous code word X(t), the next code word X(t+1), and the possible merge bits M(t)s for deciding which of the possible merge bits M(t)s satisfy the RLL(2-10) rule or the MRLL(1-10) rule, depending on which rule is being used. Various combinations of the possible merge bits M(t)s cannot be used if the least significant bit of the previous code word X(t) contains a one, or if the most significant bit of the next code word X(t+1) contains a one.

Figure 25:
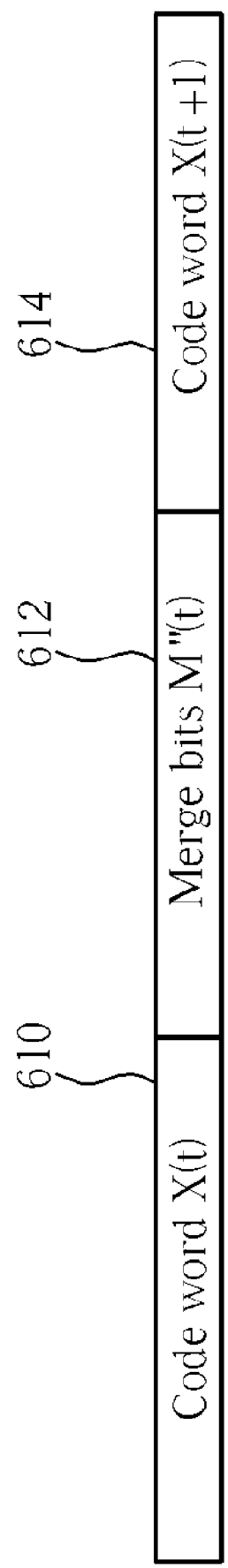
FIG. 25 illustrates merge bits M"(t) 612 inserted between code word X(t) 610 and code word X(t+1) 614.

The RLL checker 604 will output one or more candidate merge bits M'(t)s to the DSV controller 606 along with a DSV control bit indicator $ID_{dsv}$. The DSV control bit indicator $ID_{dsv}$ has a value of either zero or one. In one embodiment, the DSV control bit indicator $ID_{dsv}$ has a value of zero when there is only one candidate merge bit M'(t) output by the RLL checker 604, and has a value of one when there is two or more candidate merge bits M'(t)s output by the RLL checker 604. In another embodiment, the DSV control bit indicator $ID_{dsv}$ has a value of zero when all of the candidate merge bits M'(t)s only contain one type of polarity, for example, either all odd polarity or all even polarity. The DSV control bit indicator $ID_{dsv}$ will have a value of one when the candidate merge bits M'(t)s contain combinations of merge bits with both even and odd polarity. In any case, the DSV control bit indicator $ID_{dsv}$ having a value of 1 indicates to the DSV controller 606 that there is more than one combination of candidate merge bits M'(t)s that can be selected for insertion between two successive symbols. The inserted merge bits M"(t) is the combination of the candidate merge bits M'(t)s which optimizes the absolute cumulative DSV better than the other of the candidate merge bits M'(t)s. The inserted merge bits M"(t) which optimizes the absolute cumulative DSV is placed after the corresponding code word X(t) symbol. Please refer to FIG. 25. FIG. 25 illustrates merge bits M"(t) 612 inserted between code word X(t) 610 and code word X(t+1) 614.

The DSV controller 606 does not immediately decide which of the candidate merge bits M'(t)s to select when the DSV control bit indicator $ID_{dsv}$ is equal to one. Instead, the DSV controller 606 waits until the next time the DSV control bit indicator $ID_{dsv}$ is equal to one, which occurs the next time there is more than one combination of candidate merge bits M'(t)s, before selecting the previous inserted merge bits M"(t). In this way, the DSV controller 606 can better calculate which of the candidate merge bits M'(t)s will better optimize the absolute cumulative DSV. Alternatively, the DSV controller 606 can also wait until a predetermined delay has elapsed since the last time the control bit indicator $ID_{dsv}$ was equal to one.

When only one combination of candidate merge bits M'(t)s conforms to the RLL rule between code word X(t) and code word X(t+1), the DSV control bit indicator $ID_{dsv}$ is 0 to indicate only one combination of merge bits could be inserted between these two code words. In this case, the number of combinations of candidate merge bits M'(t)s is equal to one, and the inserted merge bits M"(t) is equal to the candidate merge bits M'(t).

When there are at least two combinations of candidate merge bits M'(t)s conforming to the RLL rule, they will have roughly the same effect on the optimization of the cumulative DSV if they have the same polarity. Choosing one of the combinations to be the final merge bits is not too much different from choosing the other. For example, when only 001 and 010 conform to the RLL rule, choosing one of the two combinations of merge bits will lead (induce) the cumulative DSV to the same polarity, although the magnitude of the cumulative DSV may be a little different.

As explained above, to better indicate the choice of combinations of candidate merge bits M'(t)s with different polarity, the DSV control bit indicator $ID_{dsv}$ can indicate this fact. The DSV control bit indicator $ID_{dsv}$ has a value of zero when all of the candidate merge bits M'(t)s only contain one type of polarity, and has a value of one when the candidate merge bits M'(t)s contain combinations of merge bits with both even and odd polarity.

When at least two combinations of candidate merge bits M'(t)s conform to the RLL rule, choosing one of them to be the inserted merge bits M"(t) over the other optimizes the cumulative DSV much better if the combinations have different polarity. For example, when the four combinations of possible valid merge bits all conform to the RLL rule, any one of the three combinations of merge bits 001, 010, and 100 with odd polarity can be chosen together with the merge bits 000 with even polarity as the two combinations of candidate merge bits M'(t)s. In this case, assume as an example that 010 and 000 are chosen as the two combinations of candidate merge bits M'(t)s. The DSV controller will determine which combination of the two candidate merge bits M'(t)s should be selected as the inserted merge bits M"(t) to optimize the cumulative DSV. Of course, all these four combinations of merge bits could be used as the candidates to optimize the cumulative DSV instead of selecting only two candidates having different polarity.

As for the invalid merge bit combination 101, this combination can be used to introduce another merge bit combination having even polarity. The combination of merge bits 101 can only be used, for example, when both the least significant bit of code word X(t) and the most significant bit of code word X(t+1) do not equal to one, and 2T run-length is permitted instead of requiring 3T run-length. With 3T run-length, at least two zeroes between each one, whereas with 2T run-length, only one zero is required to be between each one. Including the 2T run-length does not satisfy the RLL(2-10) rule, and requires the modified RLL rule MRLL(1-10).

The MRLL(1-10) rule can be used to increase the probability of occurrence of two combinations of merge bits with different polarity, and hence the cumulative DSV can be optimized more easily. Though the 2T run-length violates the original RLL(2-10) rule, the demodulation of the code word would not be influenced or may only be slightly influenced due to the fact that the 2T run-length only occurs at the position of merge bits and not in the data symbols.

When at least two combinations of merge bits are presented as candidate merge bits M'(t)s for optimizing the cumulative DSV, the method to determine which combination of candidate merge bits M'(t)s is selected as the inserted merge bits is the same as that to determine the DSV control bit (DC control bit) in the HDDVD or BD modulation.

Figure 26:
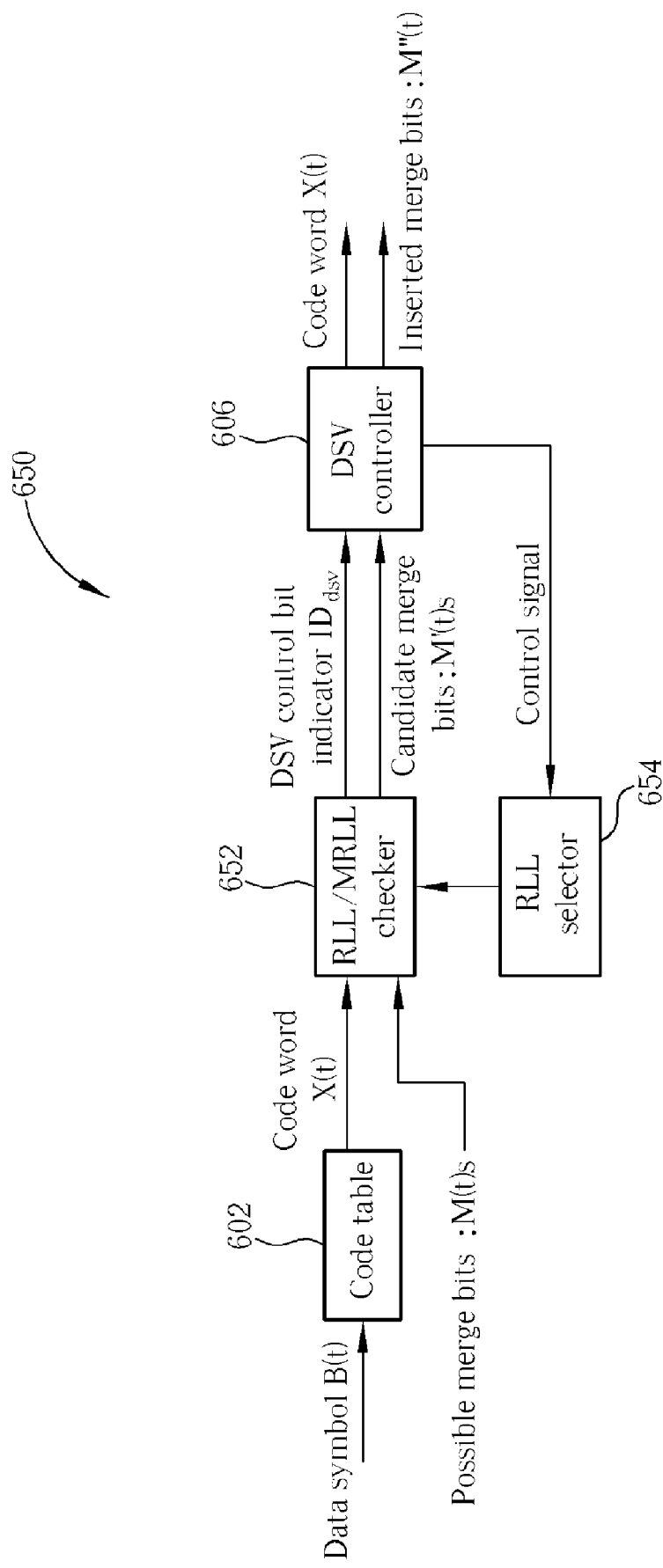
FIG. 26 is a modulation system 650 for compact discs according to another embodiment.

Please refer to FIG. 26. FIG. 26 is a modulation system 650 for compact discs according to another embodiment. The modulation system 650 comprises a code table 602, a RLL/MRLL checker 652, a DSV controller 606, and a RLL selector 654. Differing from the modulation system 600 shown in FIG. 24, the RLL/MRLL checker 652 can select candidate merge bits M'(t)s that conform to either the RLL(2-10) rule or the MRLL(1-10) rule. In addition, the RLL selector 654 is used to indicate how the RLL/MRLL checker 652 should operate according to a control signal fed back from the DSV controller 606.

With the modulation system 650, there are many possibilities for operating the RLL/MRLL checker 652. The RLL selector 654 can control the RLL/MRLL checker 652 to operate only according to the RLL(2-10) rule, only according to the MRLL(1-10) rule, or a combination of both rules. When using a combination of the two rules, the RLL(2-10) rule can be followed unless certain circumstances occur in which the use of the MRLL(1-10) would improve optimization of the cumulative DSV. For instance, the DSV controller 606 can calculate which combination of merge bits would provide the lowest absolute cumulative DSV. When the merge bits combination "101", which is only allowed with the MRLL(1-10) rule, produces a lower absolute cumulative DSV than the combinations of merge bits produced through the RLL(2-10) rule, the DSV controller 606 will indicate this fact to the RLL selector 654 through the control signal fed back from the DSV controller 606. If it is beneficial to use the MRLL(1-10) rule, the RLL selector 654 will control the RLL/MRLL checker 652 to operate using the MRLL(1-10) rule. Otherwise, the RLL selector 654 will control the RLL/MRLL checker 652 to operate using the RLL(2-10) rule.

In another embodiment, if the DSV controller 606 has received a large number of candidate merge bits M'(t)s having corresponding DSV control bit indicators $ID_{dsv}$ that are all equal to zero, the DSV controller 606 can inform the RLL selector 654 of this fact through the control signal. For example, if the number of consecutive DSV control bit indicators $ID_{dsv}$ equal to zero is greater than a predetermined number, the control signal can instruct the RLL selector 654 to change the RLL/MRLL checker 652 to operate using the MRLL(1-10) rule.

In yet another embodiment, if the DSV controller 606 has detected that the absolute cumulative DSV has increased by more than a predetermined rate of change, the DSV controller 606 can inform the RLL selector 654 of this fact through the control signal, and the RLL selector 654 will control the RLL/MRLL checker 652 to operate using the MRLL(1-10) rule.

In any case, the RLL/MRLL checker 652 provides the modulation system 650 with more flexibility to lower the absolute cumulative DSV by allowing the use of the MRLL(1-10) rule in addition to the RLL(2-10) rule.

In the modulation system 650, although 2T run-length is a valid length under the MRLL(1-10) rule, it could also be regarded as a tag in the stage of final code word generator for indicating code word replacement.

Figure 27:
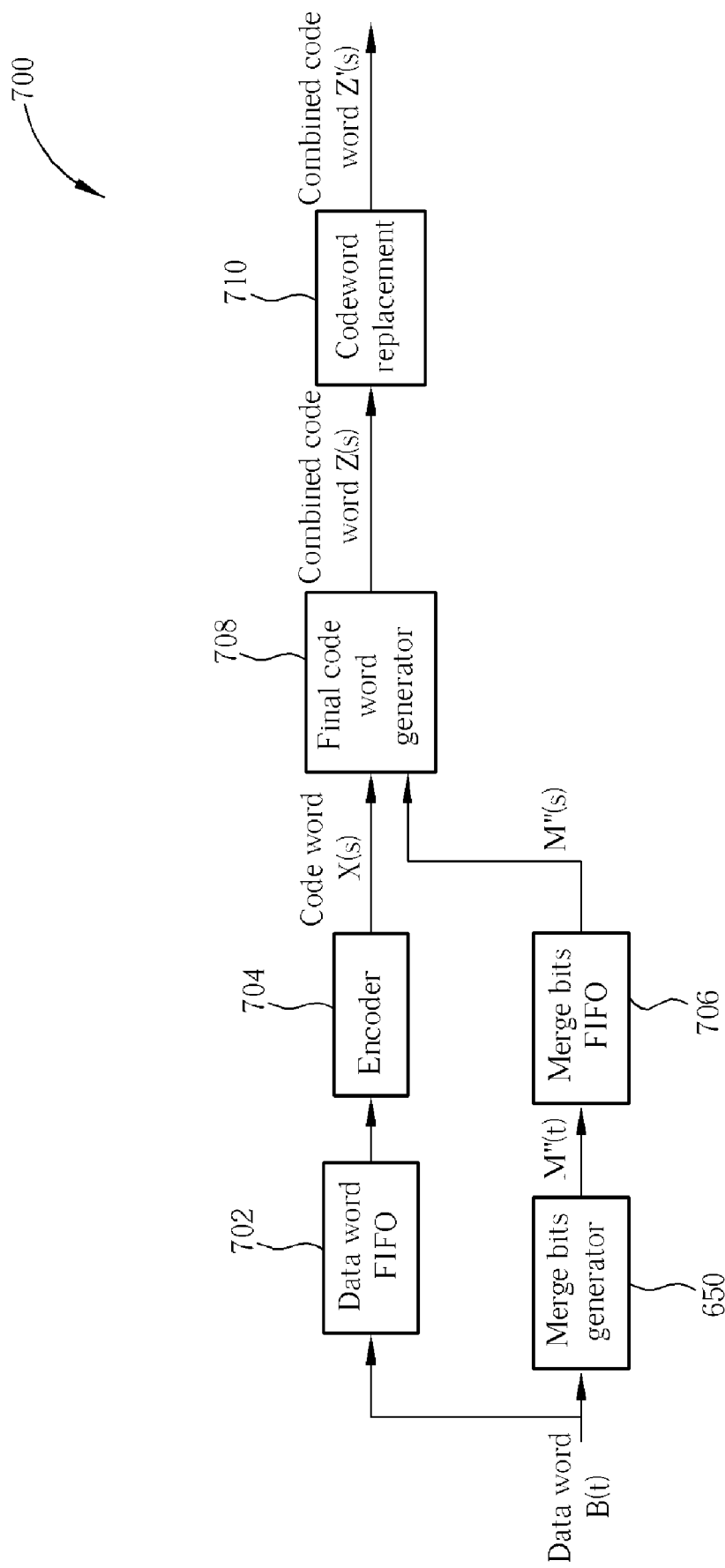
FIG. 27 is a block diagram of a modulation system 700 according to another embodiment.

Please refer to FIG. 27. FIG. 27 is a block diagram of a modulation system 700 according to another embodiment. The modulation system 700 utilizes the modulation system 650 shown in FIG. 26 as a merge bits generator 650 for reading data word B(t) and producing merge bits M"(t) that are stored in a merge bits FIFO 706. The data word B(t) is also stored in a data word FIFO 702, which an encoder 704 is connected to for encoding code words X(s). The determined merge bits M"(s) read out from the merge bits FIFO 706, together with its corresponding code word X(s) are combined by a final code word generator 708 to produce the combined code word Z(s). In other words, Z(s)={X(s) M"(s)}. For example, X(s)=01_0001_0001_0001 and M"(s)=001 would produce Z(s)=01_0001_0001_0001_001. A codeword replacement block 710 corrects the combined code word Z(s) having 2T run-length by replacing Z(s) with a combined code word Z'(s). The combined code word Z'(s) therefore has a run-length between 3T to 12T. In other words, the combined code word Z'(s) meets the RLL(2-10) rule.

The merge bits M"(s) corresponding to the code word X(s) had been processed with DSV control, thus the combined code word Z(s) generated from the code word X(s) and M"(s) optimizes the cumulative digital sum value. However, in order to keep the convergence of the digital sum value (DSV), the partial DSV polarity (which is depending on the total number of 1s) of the combined code word Z'(s) should be the same as that of the original combined code word Z(s). The example is shown in FIG. 28. In case 1, the combined code word Z(s) 01_0000_0100_0010_000 with three 1s do not have any 2T run-length, so the codeword replacement block would do nothing and hence the combined code word Z'(s) is the same as Z(s). In case 2, the combined code word Z(s) 01_0001_0001_0001_010 with five 1s has 2T run-length, so the codeword replacement block could replace it by a combined code word Z'(s) 01_0000_0001_0000_010 with three 1s. In case 3, the combined code word Z(s) 00_0100_0010_0100_100 with four 1s do not have any 2T run-length, so the codeword replacement block would do nothing and hence the combined code word Z'(s) is the same as Z(s). In case 4, the combined code word Z(s) 00_0010_0001_0000_101 with four 1s has 2T run-length, so the codeword replacement block could replace it by a combined code word Z'(s) 00_0010_0001_0001_001 with four 1s. Hence, the codeword replacement block recognizes the combined code word Z(s) with invalid run-length and substitutes it by another combined code word Z'(s) with valid run-length. The code word Z'(s) still keep the cumulative digital sum value convergent. One drawback of the codeword replacement is that more effort should be taken to correct the replaced codeword by Error Correction Code (ECC). To prevent from taking more effort to correct the replaced codeword by Error Correction Code, the codeword replacement block could be discarded, and hence the 2T run-length will be recorded onto the disc.

Certain terms are used throughout the following description and claims to refer to particular system components. As one skilled in the art will appreciate, consumer electronic equipment manufacturers may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ". Also, the term "couple" or "couples" is intended to mean either an indirect or direct electrical connection. Thus, if a first device couples to a second device, that connection may be through a direct electrical connection, or through an indirect electrical connection via other devices and connections.

Those skilled in the art will readily observe that numerous modifications and alterations of the device and method may be made while retaining the teachings of the invention.

Accordingly, the above disclosure should be construed as limited only by the metes and bounds of the appended claims.

What is claimed is:

1. A modulation method for symbols in a frame of a compact disc, comprising the steps of:
    receiving a plurality of data words;
    modulating each data word into a code word of a corresponding data symbol;
    providing a plurality of combinations of potential merge bits to be inserted between successive symbols of the frame;
    generating at least one combination of candidate merge bits according to the plurality of combinations of potential merge bits, a data symbol immediately preceding the location of the candidate merge bits, and a data symbol immediately succeeding the location of the candidate merge bits, wherein each combination of candidate merge bits satisfies a predetermined run length restriction on bits contained in the frame; and
    when a group of possible combinations of candidate merge bits is detected:
        calculating a cumulative digital sum value (DSV) for each combination of candidate merge bits;
        selecting the combination of candidate merge bits which minimizes (optimizes) the absolute cumulative DSV when a subsequent group of possible combinations of candidate merge bits is detected or after a predetermined delay; and
        inserting the selected combination of candidate merge bits between the two successive data symbols.

2. The modulation method of claim 1, wherein the group of possible combinations of candidate merge bits and the subsequent group of possible combinations of candidate merge bits both include at least one combination of candidate merge bits having even polarity and at least one combination of candidate merge bits having odd polarity.

3. The modulation method of claim 1, wherein generating at least one combination of candidate merge bits comprises choosing potential merge bits that satisfy a Modified Run Length Limited (MRLL) 1-10 rule stipulating that binary ones are separated by a minimum of one and a maximum of ten binary zeroes.

4. The modulation method of claim 1, wherein generating at least one combination of candidate merge bits comprises choosing potential merge bits that satisfy a Run Length Limited (RLL) 2-10 rule stipulating that binary ones are separated by a minimum of two and a maximum of ten binary zeroes.

5. The modulation method of claim 4, wherein generating at least one combination of candidate merge bits comprises choosing potential merge bits that satisfy a Modified Run Length Limited (MRLL) 1-10 rule stipulating that binary ones are separated by a minimum of one and a maximum of ten binary zeroes.

6. The modulation method of claim 5, further comprising utilizing the MRLL 1-10 rule for generating at least one combination of candidate merge bits when a combination of candidate merge bits generated by the MRLL 1-10 rule produces a lower absolute cumulative DSV than all combinations of candidate merge bits generated by the RLL 2-10 rule.

7. The modulation method of claim 5, further comprising utilizing the MRLL 1-10 rule for generating at least one combination of candidate merge bits instead of the RLL 2-10 rule when a predetermined number of data symbols have been processed without producing another subsequent group of possible combinations of candidate merge bits.

8. The modulation method of claim 5, further comprising utilizing the MRLL 1-10 rule for generating at least one combination of candidate merge bits instead of the RLL 2-10 rule when the absolute cumulative DSV increases more than a predetermined rate of change.

9. A modulation system for modulating symbols in a frame of a compact disc, the modulation system comprising:
    a code table for converting a plurality of data words into code words for corresponding data symbols;
    a Run Length Limited (RLL) checking device for receiving a plurality of combinations of potential merge bits to be inserted between successive symbols of the frame and for generating at least one combination of candidate merge bits according to the plurality of combinations of potential merge bits, a data symbol immediately preceding the location of the candidate merge bits, and a data symbol immediately succeeding the location of the candidate merge bits, wherein each combination of candidate merge bits satisfies a predetermined run length restriction on bits contained in the frame; and
    a digital sum value (DSV) controller, wherein when a group of possible combinations of candidate merge bits is detected, the DSV controller calculates a cumulative DSV for each combination of candidate merge bits, selects the combination of candidate merge bits which minimizes (optimizes) the absolute cumulative DSV when a subsequent group of possible combinations of candidate merge bits is detected or after a predetermined delay, and inserts the selected combination of candidate merge bits between the two successive data symbols.

10. The modulation system of claim 9, wherein the group of possible combinations of candidate merge bits and the subsequent group of possible combinations of candidate merge bits both include at least one combination of candidate merge bits having even polarity and at least one combination of candidate merge bits having odd polarity.

11. The modulation system of claim 9, wherein the RLL checking device generating at least one combination of candidate merge bits comprises choosing potential merge bits that satisfy a Modified Run Length Limited (MRLL) 1-10 rule stipulating that binary ones are separated by a minimum of one and a maximum of ten binary zeroes.

12. The modulation system of claim 9, wherein the RLL checking device generating at least one combination of candidate merge bits comprises choosing potential merge bits that satisfy a RLL 2-10 rule stipulating that binary ones are separated by a minimum of two and a maximum of ten binary zeroes.

13. The modulation system of claim 12, wherein the RLL checking device generating at least one combination of candidate merge bits comprises choosing potential merge bits that satisfy a Modified Run Length Limited (MRLL) 1-10 rule stipulating that binary ones are separated by a minimum of one and a maximum of ten binary zeroes.

14. The modulation system of claim 13, further comprising a RLL selector electrically connected to the DSV controller and the RLL checking device for controlling the RLL checking device to utilize the MRLL 1-10 rule for generating at least one combination of candidate merge bits when a combination of candidate merge bits generated by the MRLL 1-10 rule produces a lower absolute cumulative DSV than all combinations of candidate merge bits generated by the RLL 2-10 rule.

15. The modulation system of claim 13, further comprising a RLL selector electrically connected to the DSV controller and the RLL checking device for controlling the RLL checking device to utilize the MRLL 1-10 rule for generating at least one combination of candidate merge bits instead of the RLL 2-10 rule when a predetermined number of data symbols have been processed without producing another subsequent group of possible combinations of candidate merge bits.

16. The modulation system of claim 13, further comprising a RLL selector electrically connected to the DSV controller and the RLL checking device for controlling the RLL checking device to utilize the MRLL 1-10 rule for generating at least one combination of candidate merge bits instead of the RLL 2-10 rule when the absolute cumulative DSV increases more than a predetermined rate of change.

17. A modulation method for symbols in a frame of a compact disc, comprising the steps of:
  receiving a plurality of data words;
  modulating each data word into a code word of a corresponding data symbol;
  providing a plurality of combinations of potential merge bits to be inserted between successive symbols of the frame;
  generating at least one combination of candidate merge bits according to the plurality of combinations of potential merge bits, a data symbol immediately preceding the location of the candidate merge bits, and a data symbol immediately succeeding the location of the candidate merge bits, wherein each combination of candidate merge bits satisfies a Modified Run Length Limited (MRLL) 1-10 rule stipulating that binary ones are separated by a minimum of one and a maximum of ten binary zeroes; and
  when a group of possible combinations of candidate merge bits is detected:
    calculating a cumulative digital sum value (DSV) for each combination of candidate merge bits;
    selecting the combination of candidate merge bits which minimizes (optimizes) the absolute cumulative DSV when a subsequent group of possible combinations of candidate merge bits is detected or after a predetermined delay; and
    inserting the selected combination of candidate merge bits between the two successive data symbols.

18. The modulation method of claim 17, wherein the group of possible combinations of candidate merge bits and the subsequent group of possible combinations of candidate merge bits both include at least one combination of candidate merge bits having even polarity and at least one combination of candidate merge bits having odd polarity.

* * * * *